United States Patent
Todaka et al.

(10) Patent No.: US 11,895,919 B2
(45) Date of Patent: *Feb. 6, 2024

(54) PRODUCTION METHOD FOR CHIP MADE OF THERMOELECTRIC CONVERSION MATERIAL AND METHOD FOR MANUFACTURING THERMOELECTRIC CONVERSION MODULE USING CHIP OBTAINED BY SAID PRODUCTION METHOD

(71) Applicant: LINTEC CORPORATION, Itabashi-ku (JP)

(72) Inventors: Masaya Todaka, Saitama (JP); Kunihisa Kato, Warabi (JP); Tsuyoshi Muto, Saitama (JP); Yuma Katsuta, Gyoda (JP)

(73) Assignee: LINTEC CORPORATION, Itabashi-ku (JP)

( * ) Notice: Subject to any disclaimer, the term of this patent is extended or adjusted under 35 U.S.C. 154(b) by 151 days.

This patent is subject to a terminal disclaimer.

(21) Appl. No.: 17/271,091

(22) PCT Filed: Aug. 27, 2019

(86) PCT No.: PCT/JP2019/033408
§ 371 (c)(1),
(2) Date: Feb. 24, 2021

(87) PCT Pub. No.: WO2020/045379
PCT Pub. Date: Mar. 5, 2020

(65) Prior Publication Data
US 2021/0376218 A1  Dec. 2, 2021

(30) Foreign Application Priority Data

Aug. 28, 2018  (JP) ................. 2018-159254
Sep. 28, 2018  (JP) ................. 2018-185811

(51) Int. Cl.
*H10N 10/00* (2023.01)
*H10N 10/817* (2023.01)
(Continued)

(52) U.S. Cl.
CPC .......... *H10N 10/01* (2023.02); *H10N 10/817* (2023.02); *H10N 10/852* (2023.02)

(58) Field of Classification Search
CPC ......... H01L 35/34; H01L 35/08; H01L 35/16; H01L 35/32; H10N 10/01; H10N 10/852; H10N 10/817
See application file for complete search history.

(56) References Cited

U.S. PATENT DOCUMENTS 7,531,739 B1   5/2009  Moczygemba
2003/0041892 A1  3/2003  Fleurial et al.
(Continued)

FOREIGN PATENT DOCUMENTS

JP  2010-109132 A  5/2010
JP  2010-192764 A  9/2010
(Continued)

OTHER PUBLICATIONS

KR100984108B1, Park, Machine Translation (Year: 2010).*
(Continued)

*Primary Examiner* — Devina Pillay
(74) *Attorney, Agent, or Firm* — Oblon, McClelland, Maier & Neustadt, L.L.P.

(57) ABSTRACT

Provided are: a method for producing a chip of a thermoelectric conversion material that enables annealing treatment of a thermoelectric conversion material in the form not having a junction with an electrode, and enables annealing of a thermoelectric semiconductor material at an optimum annealing temperature; and a method for producing a thermoelectric conversion module using the chip (13). Also (Continued)

provided are: a method for producing a chip of a thermoelectric conversion material formed of a thermoelectric semiconductor composition, including (A) a step of forming a sacrificial layer (2) on a substrate (1), (B) a step of forming a chip of a thermoelectric conversion material on the sacrificial layer formed in the step (A), (C) a step of annealing the chip of a thermoelectric conversion material formed in the step (B), and (D) a step of peeling the chip of a thermoelectric conversion material annealed in the step (C); and a method for producing a thermoelectric conversion module using the chip produced according to the production method.

21 Claims, 3 Drawing Sheets

(51) Int. Cl.
*H10N 10/852* (2023.01)
*H10N 10/01* (2023.01)

(56) References Cited

U.S. PATENT DOCUMENTS

| | | | | |
|---|---|---|---|---|
| 2005/0203239 A1* | 9/2005 | Shibahara | ................. | C08J 5/08 |
| | | | | 524/556 |
| 2010/0108117 A1 | 5/2010 | Hamano et al. | | |
| 2016/0163950 A1* | 6/2016 | Liao | ........................ | H01L 35/08 |
| | | | | 136/201 |
| 2017/0373240 A1* | 12/2017 | Kato | ........................ | H01L 35/34 |
| 2018/0145056 A1 | 5/2018 | Yoo et al. | | |
| 2018/0179419 A1* | 6/2018 | Kakinuma | ............... | B32B 5/024 |
| 2018/0233648 A1* | 8/2018 | Cho | ........................ | H01L 35/32 |

FOREIGN PATENT DOCUMENTS

| | | | | | |
|---|---|---|---|---|---|
| JP | | 2012-204452 A | | 10/2012 | |
| JP | | 2013-251333 A | | 12/2013 | |
| JP | | 2017-41540 A | | 2/2017 | |
| JP | | 2017-98283 A | | 6/2017 | |
| KR | | 10-0984108 | * | 9/2010 | |
| WO | WO-2016104615 A1 | * | 6/2016 | ............. | F25B 21/02 |

OTHER PUBLICATIONS

International Search Report dated Nov. 19, 2019 in PCT/JP2019/033408 filed on Aug. 27, 2019, 2 pages.
Office Action dated Apr. 17, 2023, in Korean patent application No. 10-22021-7005951, with Engiish translation, 20 pages.
JIS Z 0237:2009, Testing methods of pressure-sensitive adhesive tapes and sheets, 2009, 25 pages, and as the translation, an English version "JIS Z 0237: 2000, Testing methods of pressure-sensitive adhesive tapes and sheets", 2007, 19 pages.
Office Action dated Apr. 17, 2023, in corresponding Korean Patent Application No. 10-2021-7005951 (with English Translation), 20 pages.

* cited by examiner

PRODUCTION METHOD FOR CHIP MADE OF THERMOELECTRIC CONVERSION MATERIAL AND METHOD FOR MANUFACTURING THERMOELECTRIC CONVERSION MODULE USING CHIP OBTAINED BY SAID PRODUCTION METHOD

TECHNICAL FIELD

The present invention relates to a method for producing a chip of a thermoelectric conversion material that carries out energy interconversion between heat and electricity, and to a method for producing a thermoelectric conversion module using the chip produced according to the production method.

BACKGROUND ART

Heretofore, there is known a device that enables direct interconversion between heat energy and electric energy by a thermoelectric conversion module having a thermoelectric effect such as a Seebeck effect and a Peltier effect, as one means of effective energy utilization.

As the thermoelectric conversion module, use of a so-called n-type thermoelectric conversion device is known. Regarding the n-type device, a pair of electrodes spaced from each other are arranged on a substrate and, for example, a P-type thermoelectric element is arranged on one electrode while an N-type thermoelectric element is on the other electrode, as similarly spaced from each other, and the upper faces of the two thermoelectric materials are connected to the electrodes of a facing substrate to constitute such a n-type device. In addition, use of a so-called in-plane-type thermoelectric conversion device is known. Regarding the in-plane-type device, P-type thermoelectric elements and N-type thermoelectric elements are alternately arranged in the in-plane direction of a substrate, and for example, the lower parts of the junctions between the two thermoelectric elements are connected in series via an electrode therebetween to constitute such an in-plane-type device.

Given the situation, there are demands for improving the flexibility of thermoelectric conversion modules, thinning the modules and improving the thermoelectric performance thereof. For satisfying these demands, for example, a resin substrate of polyimide or the like is used as a substrate for thermoelectric conversion modules from the viewpoint of heat resistance and flexibility thereof. As an N-type thermoelectric semiconductor material and a P-type thermoelectric semiconductor material, a thin film of a bismuth telluride material is used from the viewpoint of thermoelectric performance, and as an electrode, a Cu electrode having a high thermal conductivity and a low resistance is used (PTLs 1 and 2).

CITATION LIST

Patent Literature

PTL 1: JP 2010-192764 A
PTL 2: JP 2012-204452 A

SUMMARY OF INVENTION

Technical Problem

However, as described above, regarding the above-mentioned demands for improving the flexibility of thermoelectric conversion modules, thinning the modules and improving the thermoelectric performance thereof, the present inventors' investigations have revealed a risk of occurrence of some new problems that, in the case where a bismuth telluride material is used as a thermoelectric semiconductor material to be contained in a thermoelectric conversion material formed of a thermoelectric semiconductor composition, a Cu electrode is used as an electrode and a polyimide or the like resin is used as a substrate, and for example, in a step of annealing a thermoelectric conversion module at a high temperature of 300° C. or so, an alloy layer is formed by diffusion in the junction between the thermoelectric semiconductor material contained in the thermoelectric conversion material and the Cu electrode and, as a result, the electrode may often crack or peel to increase the electric resistance value between the thermoelectric conversion material and the Cu electrode to thereby result in thermoelectric performance degradation.

In addition to this, even in a case of using a supporting substrate of a heat-resistance resin such as the above-mentioned polyimide, heat resistance could not be maintained up to an optimum annealing temperature (that is, a processing temperature at which thermoelectric performance can be exhibited maximally) that depends on the thermoelectric semiconductor material contained in the P-type thermoelectric element layer and the N-type thermoelectric element layer used, and for this reason, the thermoelectric semiconductor material could not be processed for optimum annealing treatment.

In consideration of the above, an object of the present invention is to provide a method for producing a chip of a thermoelectric conversion material that enables annealing treatment of a thermoelectric conversion material in the form not having a junction with an electrode, and enables annealing of a thermoelectric semiconductor material at an optimum annealing temperature, and to provide a method for producing a thermoelectric conversion module using the chip.

Solution to Problem

The present inventors have assiduously made repeated studies for solving the above-mentioned problems and, as a result, have found a method for producing plural chips of a thermoelectric conversion material annealed in the form not having a junction with an electrode, which includes providing a specific sacrificial layer on a substrate, then forming a predetermined pattern layer of a thermoelectric conversion material on the sacrificial layer, annealing these at a high temperature, and thereafter peeling the chips from the sacrificial layer (hereinafter the chip may be referred to as "a self-standing film of a thermoelectric conversion material" or simply as "a self-standing film"), and also a method for producing a thermoelectric conversion module using the chip, and have completed the present invention.

Specifically, the present invention provides the following (1) to (30):

(1) A method for producing a chip of a thermoelectric conversion material formed of a thermoelectric semiconductor composition, including (A) a step of forming a sacrificial layer on a substrate, (B) a step of forming a chip of a thermoelectric conversion material on the sacrificial layer formed in the step (A), (C) a step of annealing the chip of a thermoelectric conversion material formed in the step (B), and (D) a step of peeling the chip of a thermoelectric conversion material annealed in the step (C).

(2) The method for producing a chip of a thermoelectric conversion material according to the above (1), wherein the sacrificial layer contains a resin or a release agent.

(3) The method for producing a chip of a thermoelectric conversion material according to the above (2), wherein the resin is a thermoplastic resin.

(4) The method for producing a chip of a thermoelectric conversion material according to the above (3), wherein the thermoplastic resin is a polymethyl methacrylate or a polystyrene.

(5) The method for producing a chip of a thermoelectric conversion material according to any of the above (1) to (4), wherein the release agent is a fluorine-based release agent or a silicone-based release agent.

(6) The method for producing a chip of a thermoelectric conversion material according to any of the above (1) to (5), wherein the thickness of the sacrificial layer is 10 nm to 10 μm.

(7) The method for producing a chip of a thermoelectric conversion material according to any of the above (1) to (6), wherein the substrate is one selected from the group consisting of glass, alumina and silicon.

(8) The method for producing a chip of a thermoelectric conversion material according to any of the above (1) to (7), wherein the thermoelectric semiconductor composition contains a thermoelectric semiconductor material, and the thermoelectric semiconductor material is a bismuth-tellurium-based thermoelectric semiconductor material, a telluride-based thermoelectric semiconductor material, an antimony-tellurium-based thermoelectric semiconductor material, or a bismuth-selenide-based thermoelectric semiconductor material.

(9) The method for producing a chip of a thermoelectric conversion material according to the above (8), wherein the thermoelectric semiconductor composition further contains a heat-resistant resin, and an ionic liquid and/or an inorganic ionic compound.

(10) The method for producing a chip of a thermoelectric conversion material according to the above (9), wherein the heat-resistant resin is a polyimide resin, a polyamide resin, a polyamideimide resin, or an epoxy resin.

(11) The method for producing a chip of a thermoelectric conversion material according to any of the above (1) to (10), wherein the annealing temperature is 250 to 600° C.

(12) The method for producing a chip of a thermoelectric conversion material according to any of the above (1) to (11), wherein the step (D) includes (D-1) a step of peeling the chip of a thermoelectric conversion material annealed in the step (C) from the sacrificial layer and transferring it to a pressure-sensitive adhesive layer of a pressure-sensitive adhesive sheet, and (D-2) a step of lowering the adhesive strength of the pressure-sensitive adhesive layer to peel the chip of a thermoelectric conversion material transferred in the step (D-1), from the pressure-sensitive adhesive layer.

(13) The method for producing a chip of a thermoelectric conversion material according to the above (12), wherein, in the step (D-2), the adhesive strength of the pressure-sensitive adhesive layer is lowered by heating or irradiation with energy ray.

(14) The method for producing a chip of a thermoelectric conversion material according to the above (12) or (13), wherein the pressure-sensitive adhesive layer contains an energy ray-curable pressure-sensitive adhesive, a thermally-curable pressure-sensitive adhesive, or a thermally-foamable pressure-sensitive adhesive.

(15) The method for producing a chip of a thermoelectric conversion material according to any of the above (12) to (14), wherein the chip of a thermoelectric conversion material is formed according to a stencil printing method.

(16) The method for producing a chip of a thermoelectric conversion material according to any of the above (12) to (15), wherein a ratio of the thickness of the pressure-sensitive adhesive layer to the thickness of the chip of a thermoelectric conversion material is 5/100 to 70/100.

(17) The method for producing a chip of a thermoelectric conversion material according to any of the above (12) to (16), wherein the adhesive strength of the pressure-sensitive adhesive layer, before treated for adhesive strength reduction, to a mirror face of a silicon wafer is 1.0 N/25 mm or more.

(18) The method for producing a chip of a thermoelectric conversion material according to any of the above (12) to (17), wherein the adhesive strength of the pressure-sensitive adhesive layer, after treated for adhesive strength reduction, to a mirror face of a silicon wafer is less than 1.0 N/25 mm.

(19) The method for producing a chip of a thermoelectric conversion material according to any of the above (12) to (18), further including a step of forming a solder-receiving layer on the chip of a thermoelectric conversion material annealed in the step (C) and/or on the surface opposite to the surface of the chip of a thermoelectric conversion material transferred in the step (D-2).

(20) The method for producing a chip of a thermoelectric conversion material according to the above (19), wherein the solder-receiving layer is formed of a metal material.

(21) A method for producing a thermoelectric conversion module of a combination of plural chips of a thermoelectric conversion material produced in the production method for a chip of a thermoelectric conversion material according to any of the above (1) to (20), including:

(I) a step of forming a first electrode on a first resin film, (II) a step of forming a second electrode on a second resin film, (III) a step of forming a bonding material layer 1 on the first electrode formed in the step (I), (IV) a step of mounting one surface of the chip of a thermoelectric conversion material on the bonding material layer 1 formed in the step (III), (V) a step of bonding one surface of the chip of a thermoelectric conversion material mounted in the step (IV) to the first electrode via the bonding material layer 1 formed in the step (III), and (VI) a step of bonding the other surface of the chip of a thermoelectric conversion material after the step (V) to the second electrode formed in the step (II) via a bonding material layer 2.

(22) A method for producing a thermoelectric conversion module of a combination of plural chips of a thermoelectric conversion material produced in the production method for a chip of a thermoelectric conversion material according to the above (19) or (20), including:

(XI) a step of forming a first electrode on a first resin film, (XII) a step of forming a second electrode on a second resin film, (XIII) a step of forming a solder material layer on the first electrode formed in the step (XI), (XIV) a step of mounting one surface of the chip of a thermoelectric conversion material having a solder-receiving layer on the solder material layer formed in the step (XIII), (XV) a step of bonding one surface of the chip of a thermoelectric conversion material having a solder-receiving layer mounted in the step (XIV) to the first electrode via the solder material layer formed in the step (XIII), and (XVI) a step of bonding the solder-receiving layer on the other surface of the chip of a thermoelectric conversion material after the step (XV) to the second electrode formed in the step (XII) via the solder material layer.

(23) A method for producing a thermoelectric conversion module of a combination of plural chips of a thermoelectric conversion material formed of a thermoelectric semiconductor composition, including:

(i) a step of forming a sacrificial layer on a substrate, (ii) a step of forming a chip of a thermoelectric conversion material on the sacrificial layer formed in the step (i), (iii) a step of annealing the chip of a thermoelectric conversion material formed in the step (ii), (iv) a step of preparing a first layer having a first resin film and a first electrode in that order, (v) a step of preparing a second-A layer having a second resin film and a second electrode in that order, or a second-B layer having a second resin film but not having an electrode, (vi) a step of bonding one surface of the chip of a thermoelectric conversion layer annealed in the step to the electrode of the first layer prepared in the step (iv) via a bonding material layer 1, (vii) a step of peeling the other surface of the chip of a thermoelectric conversion material after the step (vi) from the sacrificial layer, and (viii) a step of bonding the other surface of the resultant chip of a thermoelectric conversion material peeled in the step (vii), to the second electrode of the second-A layer prepared in the step (v) via a bonding material layer 2, or to the second-B layer prepared in the step (v) via a bonding material layer 3.

(24) The method for producing a thermoelectric conversion module according to the above (23), wherein:

the step (v) is a step of preparing a second-A layer having a second resin film and a second electrode in that order, and the step (viii) is a step of bonding the other surface of the resultant chip of a thermoelectric conversion material peeled in the step (vii) to the second electrode of the second-A layer prepared in the step (v) via a bonding material layer 2.

(25) The method for producing a thermoelectric conversion module according to the above (23), wherein:

the step (v) is a step of preparing a second-B layer having a second resin film but not having an electrode, and the step (viii) is a step of bonding the other surface of the resultant chip of a thermoelectric conversion material peeled in the step (vii) to the second-B layer prepared in the step (v) via a bonding material layer 3.

(26) The method for producing a thermoelectric conversion module according to any of the above (23) to (25), wherein the bonding material layers 1 and 2 each are independently formed of a solder material, an electroconductive adhesive, or a sintering bond.

(27) The method for producing a thermoelectric conversion module according to the above (23) or (25), wherein the bonding material layer 3 is formed of a resin material.

(28) The method for producing a thermoelectric conversion module according to the above (23) or (24), including a step of forming a solder-receiving layer on one surface of the chip of a thermoelectric conversion material annealed in the step (iii), and a step of forming a solder-receiving layer on the other surface of the resultant chip of a thermoelectric conversion material peeled in the step (vii).

(29) The method for producing a thermoelectric conversion module according to the above (23) or (25), including a step of forming a solder-receiving layer on the other surface of the chip of a thermoelectric conversion material annealed in the step (iii).

(30) The method for producing a thermoelectric conversion module according to the above (28) or (29), wherein the solder-receiving layer is formed of a metal material.

Advantageous Effects of Invention

According to the present invention, there can be provided a method for producing a chip of a thermoelectric conversion material that enables annealing treatment of a thermoelectric conversion material in the form not having a junction with an electrode, and enables annealing of a thermoelectric semiconductor material at an optimum annealing temperature, and a method for producing a thermoelectric conversion module using the chip.

DESCRIPTION OF EMBODIMENTS

[Production Method for Chip of Thermoelectric Conversion Material]

The method for producing a chip of a thermoelectric conversion material of the present invention is a method for producing a chip of a thermoelectric conversion material formed of a thermoelectric semiconductor composition, including (A) a step of forming a sacrificial layer on a substrate, (B) a step of forming a chip of a thermoelectric conversion material on the sacrificial layer formed in the step (A), (C) a step of annealing the chip of a thermoelectric conversion material formed in the step (B), and (D) a step of peeling the chip of a thermoelectric conversion material annealed in the step (C).

In the method for producing a chip of a thermoelectric conversion material of the present invention, a sacrificial layer is provided between a substrate and a chip of a thermoelectric conversion material, therefore readily enabling formation of a chip of a thermoelectric conversion material annealed at a high temperature, that is, enabling formation of a self-standing film of a thermoelectric conversion material.

In the present invention, the sacrificial layer may disappear or may remain after annealing treatment, and not having any influence on the properties of the chip of a thermoelectric conversion material, this can be defined as a layer having a function of peeling the chip of a thermoelectric conversion material from the sacrificial layer. In the present invention, the thermoelectric conversion material is not formed of a single layer (film) of a thermoelectric semiconductor material and is, for example, as described below, one formed of a thermoelectric semiconductor composition further containing a heat-resistant resin, an ionic liquid and others.

Figure 1:
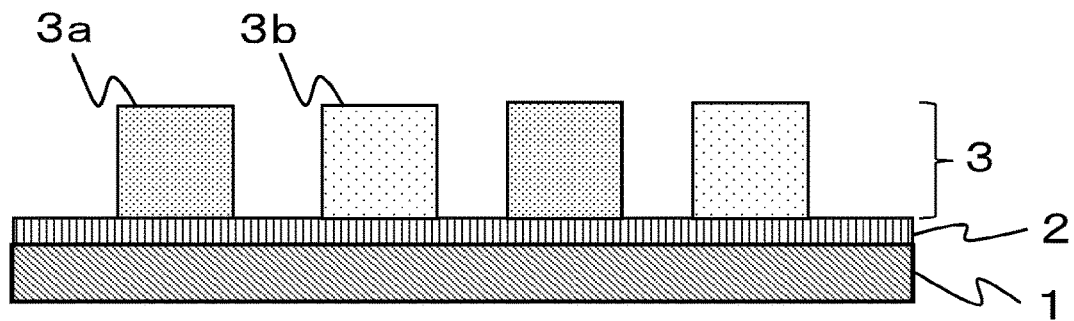
FIG. 1 is a cross-sectional configuration view for explaining an example of an embodiment of a method for producing a chip of a thermoelectric conversion material of the present invention.

FIG. 1 is a cross-sectional configuration view for explaining an example of an embodiment of a method for producing a chip of a thermoelectric conversion material of the present invention. A sacrificial layer 2 is formed on a substrate 1, then a chip 3a of a P-type thermoelectric conversion material and a chip 3b of an N-type thermoelectric conversion material, both serving as a thermoelectric conversion material 3, are formed on the sacrificial layer 2, and thereafter these are annealed at a predetermined high temperature and peeled from the sacrificial layer 2 to form a chip of a thermoelectric conversion material as a self-standing film of a thermoelectric conversion material.

(A) Sacrificial Layer Forming Step

The sacrificial layer forming step is a step of forming a sacrificial layer on a substrate, and for example, in FIG. 1, this is a step of applying a resin or a release agent to the substrate 1 to form the sacrificial layer 2.

(Sacrificial Layer)

In the production method for a chip of a thermoelectric conversion material of the present invention, a sacrificial layer is used.

The sacrificial layer is used for forming the chip of a thermoelectric conversion material as a self-standing film, and is provided between the substrate and a chip of a thermoelectric conversion material, and after annealing treatment, this functions for peeling the chip of a thermoelectric conversion material.

As mentioned above, the material of forming the sacrificial layer may be any one that disappears or remains after annealing treatment, and resultantly has a function of peeling the chip of a thermoelectric conversion material without having any influence on the properties of the resultant chip of a thermoelectric conversion material. A resin and a release agent satisfying both the functions are preferred.

(Resin)

Not specifically limited, the resin to constitute the sacrificial layer for use in the present invention may be a thermoplastic resin or a curable resin. The thermoplastic resin includes acrylic resins such as polymethyl (meth)acrylate, polyethyl (meth)acrylate, and methyl (meth)acrylate-butyl (meth)acrylate copolymers; polyolefin-based resins such as polyethylene, polypropylene, and polymethylpentene; thermoplastic polyester resins such as polycarbonate resins, polyethylene terephthalate, and polyethylene naphthalate; and polystyrene, acrylonitrile-styrene copolymers, polyvinyl acetate, ethylene-vinyl acetate copolymers, vinyl chloride, polyurethane, polyvinyl alcohol, polyvinyl pyrrolidone, and ethyl cellulose. Polymethyl (meth)acrylate means polymethyl acrylate and polymethyl methacrylate, and the same shall apply to (meth). The curable resins include thermosetting resins and photocurable resins. The thermosetting resins include epoxy resins and phenolic resins. The photocurable resins include photocurable acrylic resins, photocurable urethane resins, and photocurable epoxy resins.

Among these, from the viewpoint that a chip of a thermoelectric conversion material can be formed on a sacrificial layer and that the chip of a thermoelectric conversion material can be readily peeled as a self-standing film even after annealing treatment at a high temperature, the thermoplastic resin is preferred, polymethyl methacrylate, polystyrene, polyvinyl alcohol, polyvinyl pyrrolidone and ethyl cellulose are preferred; and from the viewpoint of raw material cost, peelability and maintenance of properties of thermoelectric conversion material, polymethyl methacrylate and polystyrene are more preferred.

Also preferably, the mass reduction ratio of the resin at an annealing temperature to be mentioned below in thermogravimetric measurement (TG) is 90% or more, more preferably 95% or more, even more preferably 99% or more. When the mass reduction ratio falls within the range, the resin does not lose the function of peeling a chip of a thermoelectric conversion material even when the chip of a thermoelectric conversion material is annealed, as mentioned below.

(Release Agent)

Not specifically limited, the release agent to constitute the sacrificial layer for use in the present invention includes a fluorine-based release agent (fluorine atom-containing compound, for example, polytetrafluoroethylene), a silicone-based release agent (silicone compound, for example, a silicone resin, a polyorganosiloxane having a polyoxyalkylene unit), a higher fatty acid or a salt thereof (for example, a metal salt), a higher fatty acid ester, and a higher fatty acid amide.

Among these, from the viewpoint that a chip of a thermoelectric conversion material can be formed on a sacrificial layer and that a chip of a thermoelectric conversion material can be readily peeled (released) as a self-standing film even after annealing treatment at a high temperature, a fluorine-based release agent, and a silicone-based release agent are preferred; and form the viewpoint of raw material cost, peelability and maintenance of properties of thermoelectric conversion material, a fluorine-based release agent is more preferred.

The thickness of the sacrificial layer is preferably 10 nm to 10 μm, more preferably 50 nm to 5 μm, even more preferably 200 nm to 2 μm. When the thickness of the sacrificial layer falls within the range, peeling after annealing treatment is easy, and the peeled chip of a thermoelectric conversion material can readily maintain thermoelectric performance.

In particular, the thickness of the sacrificial layer using a resin is preferably 50 nm to 10 μm, more preferably 100 nm to 5 μm, even more preferably 200 nm to 2 μm. When the thickness of the sacrificial layer using a resin falls within the range, peeling after annealing treatment is easy, and the peeled chip of a thermoelectric conversion material can readily maintain thermoelectric performance. Further in the case, even when any other layer is further laminated on the sacrificial layer, the self-standing film can be readily maintained as such.

Similarly, the thickness of the sacrificial layer using a release agent is preferably 10 nm to 5 μm, more preferably 50 nm to 1 μm, even more preferably 100 nm to 0.5 μm, further more preferably 200 nm to 0.1 μm. When the thickness of the sacrificial layer using a release agent falls within the range, peeling after annealing treatment is easy, and the peeled chip of a thermoelectric conversion material can readily maintain thermoelectric performance.

The sacrificial layer is formed using the above-mentioned resin or a release agent.

A method for forming the sacrificial layer includes various coating methods on a substrate, such as a dip coating method, a spin coating method, a spray coating method, a gravure coating method, a die coating method and a doctor blade method. The method is appropriately selected depending on the properties of the resin or the release agent used.

(Substrate)

The substrate includes glass, silicon, ceramic, metal and plastic. From the viewpoint of carrying out annealing treatment at a high temperature, glass, silicon, ceramic and metal are preferred; and from the viewpoint of adhesiveness to sacrificial layer, raw material cost and dimensional stability after heat treatment, use of glass, silicon and ceramic is more preferred.

The thickness of the substrate is, from the viewpoint of process and dimensional stability, preferably 100 to 1200 μm, more preferably 200 to 800 μm, even more preferably 400 to 700 μm.

(B) Thermoelectric Conversion Material Chip Forming Step

The step of forming a chip of a thermoelectric conversion material is a step of forming a chip of a thermoelectric conversion material on a sacrificial layer and, for example, in FIG. 1, this is a step of forming a chip 3 of a thermoelectric conversion material formed of a thermoelectric semiconductor composition on the sacrificial layer 2, that is, a step of forming a chip 3a of a P-type thermoelectric conversion material and a chip 3b of an N-type thermoelectric conversion material as a thin film by coating. The arrangement of the chip of a P-type thermoelectric conversion material and the chip of an N-type thermoelectric conversion material is not specifically limited, but from the viewpoint of thermoelectric performance, preferably, the chips are so arranged as to have a configuration for use in a π-type or an in-plane-type thermoelectric conversion module and are connected via an electrode.

Here, in the case of a configuration of a π-type thermoelectric conversion module, for example, a pair of electrodes spaced from each other are provided on a substrate, then a chip of a P-type thermoelectric conversion material is formed on one electrode and a chip of an N-type thermoelectric conversion material is on the other electrode in such a manner that they are also spaced from each other, and the upper faces of both chips of a thermoelectric conversion material are electrically connected in series to the electrode on the opposing substrate. From the viewpoint of efficiently achieving high-level thermoelectric performance, preferably, plural pairs of a chip of a P-type thermoelectric conversion material and a chip of an N-type thermoelectric conversion material all disposed via an electrode of the opposing substrate are electrically connected in series (see FIG. 2 (f) to be mentioned below).

Similarly, in the case of constituting an in-plane-type thermoelectric conversion module, for example, one electrode is provided on a substrate, and a chip of a P-type thermoelectric conversion material is formed on the surface of the electrode and a chip of an N-type thermoelectric conversion material is similarly formed on the surface of the electrode in such a manner that the sides of the two chip (for example, the faces in a vertical direction to the substrate) could be in contact with each other or could be spaced from each other, and the chips are electrically connected in series via the electrode in the in-plane direction of the substrate (for example, in the case of a configuration for power generation, a pair of electrodes for taking out electromotive force are additionally used). From the viewpoint of efficiently achieving high-level thermoelectric performance, preferably in the configuration, a same number of plural chips of a P-type thermoelectric conversion material and plural chips of an N-type thermoelectric conversion material are alternately electrically connected in series via an electrode in the in-plane; direction of the substrate.

(Thermoelectric Conversion Material)

The thermoelectric conversion material for use in the present invention is formed of a thermoelectric semiconductor composition. Preferably, it is formed of a thin film of a thermoelectric semiconductor composition containing a thermoelectric semiconductor material (hereinunder may be referred to as "thermal semiconductor fine particles"), a heat-resistant resin, and an ionic liquid and/or an inorganic ionic compound.

(Thermoelectric Semiconductor Material)

The thermoelectric semiconductor material for use in the present invention, namely the thermoelectric semiconductor material contained in the chip of a P-type thermoelectric conversion material and the chip of an N-type thermoelectric conversion material is not specifically limited so far as the material is one capable of generating a thermoelectric force when given a temperature difference, and examples thereof include a bismuth-tellurium-based thermoelectric semiconductor material such as a P-type bismuth telluride, and an N-type bismuth telluride; a telluride-based thermoelectric semiconductor material such as GeTe and PbTe; an antimony-tellurium-based thermoelectric semiconductor material; a zinc-antinomy-based thermoelectric semiconductor material such as ZnSb, $Zn_3Sb_2$, and $Zn_4Sb_3$; a silicon-germanium-based thermoelectric semiconductor material such as SiGe; a bismuth-selenide-based thermoelectric semiconductor material such as $Bi_2Se_3$; a silicide-based thermoelectric semiconductor material such as β-$FeSi_2$, $CrSi_2$, $MnSi_{1.73}$, and $Mg_2Si$; an oxide-based thermoelectric semiconductor material; a Heusler material such as FeVAl, FeVAlSi, and FeVTiAl; and a sulfide-based thermoelectric semiconductor material such as $TiS_2$.

Among these, a bismuth-tellurium-based thermoelectric semiconductor material, a telluride-based thermoelectric semiconductor material, an antimony-tellurium-based thermoelectric semiconductor material or a bismuth-selenide-based thermoelectric semiconductor material is preferred.

Further, from the viewpoint of thermoelectric performance, a bismuth-tellurium-based thermoelectric semiconductor material such as a P-type bismuth telluride or an N-type bismuth telluride is more preferred.

The carrier of the P-type bismuth telluride is a hole and the Seebeck coefficient thereof is positive, for which, for example, preferably used is one represented by $Bi_XTe_3Sb_{2-X}$. In this case, X preferably satisfies $0<X\leq0.8$, more preferably $0.4\leq X\leq0.6$. X being more than 0 and 0.8 or less is preferred since the Seebeck coefficient and the electrical conductivity of the material are large and the material can maintain the characteristics of a P-type thermoelectric element.

The carrier of the N-type bismuth telluride is an electron and the Seebeck coefficient thereof is negative, for which, for example, preferably used is one represented by $Bi_2Te_{3-Y}Se_Y$. In this case, Y is preferably $0\leq Y\leq3$ (when Y=0, $Bi_2Te_3$), more preferably $0\leq Y\leq2.7$. Y being 0 or more and 3 or less is preferred since the Seebeck coefficient and the electrical conductivity of the material are large and the material can maintain the characteristics of an N-type thermoelectric element.

The thermoelectric semiconductor fine particles for use in the thermoelectric semiconductor composition are those prepared by pulverizing the above-mentioned thermoelectric semiconductor material into a predetermined size using a pulverizer or the like.

The blending amount of the thermoelectric semiconductor fine particles in the thermoelectric semiconductor composition is preferably 30 to 99% by mass. The amount is more preferably 50 to 96% by mass, even more preferably 70 to 95% by mass. The blending amount of the thermoelectric semiconductor fine particles falling within the above range is preferred since the Seebeck coefficient (absolute value of Peltier coefficient) is large, the electrical conductivity reduction can be prevented, only the thermal conductivity is lowered, and therefore the composition exhibits high-level thermoelectric performance and can form a film having a sufficient film strength and flexibility.

The average particle size of the thermoelectric semiconductor fine particles is preferably 10 nm to 200 μm, more preferably 10 nm to 30 μm, even more preferably 50 nm to 10 μm, and especially preferably 1 to 6 μm. Falling within the range, uniform dispersion is easy and electrical conductivity can be increased.

The method of producing the thermoelectric semiconductor fine particles by finely pulverizing the thermoelectric semiconductor material is not specifically defined, and the material may be pulverized to have a predetermined size, using a known pulverizer or the like, such as a jet mill, a ball mill, a bead mill, a colloid mill, or a roller mill.

The average particle size of the thermoelectric semiconductor fine particles may be measured with a laser diffraction particle sizer (Master Sizer 3000 from Malvern Corporation), and the median value of the particle size distribution is taken as the average particle size.

Preferably, the thermoelectric semiconductor fine particles are previously heat-treated. ("Heat treatment as referred to herein differs from "annealing treatment" to be carried out in the annealing step in the present invention.) The heat treatment increases the crystallinity of the thermoelectric semiconductor fine particles and further increases the Seebeck coefficient or the Peltier coefficient of the thermoelectric conversion material since the surface oxide film of the thermoelectric semiconductor fine particles could be removed, therefore further increasing the figure of merit thereof. Not specifically defined, the heat treatment is preferably carried out in an inert gas atmosphere such as nitrogen or argon in which the gas flow rate is controlled or in a reducing gas atmosphere such as hydrogen in which also the gas flow rate is controlled, or in a vacuum condition, and is more preferably carried out in a mixed gas atmosphere of an inert gas and a reducing gas so as to have no negative influence on the thermoelectric semiconductor fine particles before preparing the thermoelectric semiconductor composition. Specific temperature conditions depend on the thermoelectric semiconductor fine particles to be used, but in general, it is desirable that the treatment is carried out at a temperature not higher than the melting point of the fine particles but falling between 100 and 1500° C., for a few minutes to several tens of hours.

(Heat-Resistant Resin)

In the thermoelectric semiconductor composition for use in the present invention, from the viewpoint of annealing the thermoelectric semiconductor material at a high temperature, a heat-resistant resin is preferably used. The resin acts as a binder between the thermoelectric semiconductor material (thermoelectric semiconductor fine particles) and enhances the flexibility of the thermoelectric conversion module, and in addition, the resin can facilitate formation of a thin film by coating. The heat-resistant resin is not specifically defined but is preferably one that can maintain various physical properties thereof such as mechanical strength and thermal conductivity thereof as a resin without losing them in crystal growth of the thermoelectric semiconductor fine particles through annealing treatment of the thin film of the thermoelectric semiconductor composition.

The heat-resistant resin is preferably a polyamide resin, a polyamideimide resin, a polyimide resin or an epoxy resin from the viewpoint that the heat resistance thereof is higher and that the resin has no negative influence on the crystal growth of the thermoelectric semiconductor fine particles in the thin film, and is more preferably a polyamide resin, a polyamideimide resin or a polyimide resin from the viewpoint of excellent flexibility thereof. In the case where a polyimide film is used as the substrate, the heat-resistant resin is more preferably a polyimide resin from the viewpoint of adhesiveness thereof to the polyimide film. In the present invention, polyimide resin is a generic term for polyimide and its precursors.

Preferably, the decomposition temperature of the heat-resistant resin is 300° C. or higher. When the decomposition temperature falls within the above range, the resin does not lose the function thereof as a binder and can maintain flexibility even when the thin film of the thermoelectric semiconductor composition is annealed, as described below.

Preferably, the mass reduction in the heat-resistant resin at 300° C. in thermogravimetry (TG) is 10% or less, more preferably 5% or less, even more preferably 1% or less. When the mass reduction falls within the above range, the resin does not lose the function thereof as a binder and can maintain the flexibility of the thermoelectric element even when the thin film of the thermoelectric semiconductor composition is annealed, as described below.

The blending amount of the heat-resistant resin in the thermoelectric semiconductor composition is preferably 0.1 to 40% by mass, more preferably 0.5 to 20% by mass, even more preferably 1 to 20% by mass, still more preferably 2 to 15% by mass. When the blending amount of the heat-resistant resin falls within the above range, the thermoelectric semiconductor material functions as a binder, and facilitates formation of a thin film to give a film satisfying both high-level thermoelectric performance and a high film strength.

(Ionic Liquid)

The ionic liquid for use in the present invention is a molten salt of a combination of a cation and an anion, which can exist as a liquid in a broad temperature range of −50 to 500° C. The ionic liquid is characterized in that it has an extremely low vapor pressure and is nonvolatile, has excellent thermal stability and electrochemical stability, has a low viscosity and has a high ionic conductivity, and therefore, serving as a conductive assistant, the ionic liquid can effectively prevent reduction in the electrical conductivity between thermoelectric semiconductor fine particles. In addition, the ionic liquid has high polarity based on the aprotic ionic structure thereof, and is excellent in compatibility with the heat-resistance resin, and therefore can make the thermoelectric element layer have a uniform electrical conductivity.

The ionic liquid for use herein may be a known one or a commercially-available one. Examples thereof include those composed of a cation component of a nitrogen-containing cyclic cation compound such as pyridinium, pyrimidinium pyrazolium, pyrrolidinium, piperidinium or imidazolium, or a derivative thereof, an amine-type cation such as tetraalkylammonium, or a derivative thereof, a phosphine-type cation such as phosphonium, trialkyl sulfonium or tetraalkyl phosphonium, or a derivative thereof, or a lithium cation or a derivative thereof, and an anion component of a chloride ion such as $Cl^-$, $AlCl_4^-$, $Al_2Cl_7^-$ or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)n^-$, $(CN)_2N^-$, $C_4F_9SO_3^-$, $(C_2F_5SO_2)_2N^-$, $C_3F_7COO^-$, or $(CF_3SO_2)(CF_3CO)N^-$.

Among the above-mentioned ionic liquids, it is preferable that, from the viewpoint of enhancing high-temperature stability and compatibility between thermoelectric semiconductor fine particles and resin, and preventing reduction in the electrical conductivity between thermoelectric semiconductor fine particles, the cation component in the ionic liquid contains at least one selected from a pyridinium cation and a derivative, and an imidazolium cation and a derivative thereof. It is also preferable that the anion component of the ionic liquid contains a halide anion, more preferably at least one selected from $Cl^-$, $Br^-$ and $I^-$.

Specific examples of the ionic liquid in which the cation component contains a pyridinium cation or a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Among these, 1-butyl-4-methylpyridinium bromide, 1-butyl-4-methylpyridinium hexafluorophosphate and 1-butyl-4-methylpyridinium iodide are preferred.

Specific examples of the ionic liquid in which the cation component contains an imidazolium cation or a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methylsulfate. Among these, [1-butyl-3-(2-hydroxyethyl)imidazolium bromide] and [1-butyl-3-(2-hydroxyethyl)imidazolium tetrafluoroborate] are preferred.

Preferably, the ionic liquid has an electrical conductivity of $10^{-7}$ S/cm or more, more preferably $10^{-6}$ S/cm or more. When the electrical conductivity falls within the above range, the ionic liquid can effectively prevent reduction in the electrical conductivity between thermoelectric semiconductor fine particles, serving as a conductive assistant.

Also preferably, the decomposition temperature of the ionic liquid is 300° C. or higher. When the decomposition temperature falls within the above range, the ionic liquid can still maintain the effect thereof as a conductive assistant even when the thin film of the thermoelectric semiconductor composition is annealed, as described below.

Preferably, the mass reduction in the ionic liquid at 300° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the ionic liquid in the thermoelectric semiconductor composition is preferably 0.01 to 50% by mass, more preferably 0.5 to 30% by mass, even more preferably 1.0 to 20% by mass. The blending amount of the ionic liquid falling within the above range provides a film capable of effectively preventing electrical conductivity reduction and having high thermoelectric performance.

(Inorganic Ionic Compound)

The inorganic ionic compound for use in the present invention is a compound composed of at least a cation and an anion. The inorganic ionic compound is solid at room temperature and has a melting point at any temperature falling within a temperature range of 400 to 900° C. and is characterized by having a high ionic conductivity, and therefore, serving as a conductive assistant, the compound can prevent reduction in the electrical conductivity between thermoelectric semiconductor fine particles.

A metal cation is used as the cation.

Examples of the metal cation include an alkali metal cation, an alkaline earth metal cation, a typical metal cation and a transition metal cation, and an alkali metal cation or an alkaline earth metal cation is more preferred.

Examples of the alkali metal cation include $Li^+$, $Na^+$, $K^+$, $Rb^+$, $Cs^+$ and $Fr^+$.

Examples of the alkaline earth metal cation include $Mg^{2+}$, $Ca^{2+}$, $Sr^{2+}$ and $Ba^{2+}$.

Examples of the anion include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound, known or commercially-available ones can be used. Examples thereof include those composed of a cation component such as a potassium cation, a sodium cation or a lithium cation, and an anion component, e.g., a chloride ion such as $Cl^-$, $AlCl_4^-$, $Al_2Cl_7^-$, or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $OH^-$, or $CN^-$.

Among the above-mentioned inorganic ionic compounds, those having at least one selected from potassium, sodium and lithium as the cation component are preferred from the viewpoint of securing high-temperature stability and compatibility between thermoelectric semiconductor fine particles and resin, and from the viewpoint of preventing reduction in the electrical conductivity between thermoelectric semiconductor fine particles. Also preferably, the anion component of the inorganic ionic compound contains a halide anion, more preferably at least one selected from $Cl^-$, $Br^-$ and $I^-$.

Specific examples of the inorganic ionic compound having a potassium cation as the cation component include KBr, KI, KCl, KF, KOH, and $K_2CO_3$. Among these, KBr and KI are preferred.

Specific examples of the inorganic ionic compound having a sodium cation as the cation component include NaBr, NaI, NaOH, NaF, and $Na_2CO_3$. Among these, NaBr and NaI are preferred.

Specific examples of the inorganic ionic compound having a lithium cation as the cation component include LiF, LiOH, and $LiNO_3$. Among these, LiF and LiOH are preferred.

Preferably, the above inorganic ionic compound has an electrical conductivity of $10^{-7}$ S/cm or more, more preferably $10^{-6}$ S/cm or more. When the electrical conductivity falls within the above range, the inorganic ionic compound serving as a conductive assistant can effectively prevent reduction in the electrical conductivity between the thermoelectric semiconductor fine particles.

Also preferably, the decomposition temperature of the inorganic ionic compound is 400° C. or higher. When the decomposition temperature falls within the above range, the inorganic ionic compound can still maintain the effect thereof as a conductive assistant even when the thin film of the thermoelectric semiconductor composition is annealed, as described below.

Preferably, the mass reduction in the inorganic ionic compound at 400° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the inorganic ionic compound in the thermoelectric semiconductor composition is preferably 0.01 to 50% by mass, more preferably 0.5 to 30% by mass, even more preferably 1.0 to 10% by mass. When the blending amount of the inorganic ionic compound falls within the above range, the electrical conductivity can be effectively prevented from lowering and, as a result, a film having an improved thermoelectric performance can be realized.

In the case where the inorganic ionic compound and the ionic liquid are used together, the total content of the inorganic ionic compound and the ionic liquid in the thermoelectric semiconductor composition is preferably 0.01 to 50% by mass, more preferably 0.5 to 30% by mass, even more preferably 1.0 to 10% by mass.

(Other Additives)

The thermoelectric semiconductor composition for use in the present invention may further contain, as needed, other additives such as a dispersant, a film-forming aid, a light stabilizer, an antioxidant, a tackifier, a plasticizer, a colorant, a resin stabilizer, a filler, a pigment, an electroconductive filler, an electroconductive polymer and a curing agent, in addition to the above-mentioned components. One alone or two or more kinds of these additives may be used either singly or as combined.

(Method for Preparing Thermoelectric Semiconductor Composition)

The method for preparing the thermoelectric semiconductor composition for use in the present invention is not specifically defined. The thermoelectric semiconductor composition may be prepared by mixing and dispersing the above-mentioned thermoelectric semiconductor fine particles, the above-mentioned heat-resistant resin, and one or both of the above-mentioned ionic liquid and inorganic ionic compound, optionally along with any other additives and also with a solvent added thereto, according to a known method using an ultrasonic homogenizer, a spiral mixer, a planetary mixer, a disperser, or a hybrid mixer.

Examples of the solvent include toluene, ethyl acetate, methyl ethyl ketone, alcohols, tetrahydrofuran, methylpyrrolidone, and ethyl cellosolve. One alone or two or more different types of these solvents may be used here either singly or as combined. The solid concentration of the thermoelectric semiconductor composition is not specifically defined so far as the composition may have a viscosity suitable for coating operation.

A thin film of the thermoelectric semiconductor composition may be formed by applying the thermoelectric semiconductor composition onto the sacrificial layer formed in the present invention and drying it thereon. According to the formation method, a large-area thermoelectric element layer can be formed in a simplified manner at a low cost.

The method of applying the thermoelectric semiconductor composition to a substrate is not specifically defined, for which employable is any known method of screen printing, flexographic printing, gravure printing, spin coating, dip coating, die coating, spray coating, bar coating, or doctor blade coating. In the case where the coating film is pattern-like formed, preferably employed is screen printing, stencil printing or slot die coating that realizes patterning in a simplified manner using a screen having a desired pattern.

Next, the resultant coating film is dried to give a thin film. As the drying method, employable is any known drying method such as hot air drying, hot roll drying, or IR radiation. The heating temperature is generally 80 to 150° C., and the heating time is generally a few seconds to several tens of minutes though it varies depending on the heating method.

In the case where a solvent is used in preparing the thermoelectric semiconductor composition, the heating temperature is not specifically defined so far as it falls within a temperature range capable of removing the used solvent through vaporization.

As other methods of applying the thermoelectric semiconductor composition to a substrate in the present invention, from the viewpoint of controlling the shape of the resultant chip formed of the thermoelectric conversion material, a screen printing method or a stencil printing method is more preferred in a multilayer printing method or a pattern frame placing/peeling method to be mentioned below.

(Multilayer Printing Method)

A multilayer printing method is a method for forming a chip of a thin-film thermoelectric conversion material by laminating plural times a thin film of a thermoelectric conversion material, in which, using a coating liquid of a thermoelectric conversion composition and using a screen or a stencil plate having a desired pattern, printing is repeated plural times at the same position on a substrate or an electrode according to a screen printing method or a stencil printing method.

Specifically, first, a coating film of a thin film of a thermoelectric conversion material to be a first layer is formed, and the resultant coating film is dried to give a thin film of a thermoelectric conversion material of the first layer. Next, like that for the first layer, a coating film of a thin film of a thermoelectric conversion material to be a second layer is formed on the thin film of a thermoelectric conversion material of the first layer, and the resultant coating film is dried to give a thin film of a thermoelectric conversion material of the second layer. For a third layer and the subsequent layers, similarly, a coating film that is a thin film of a thermoelectric conversion material is formed on the thin film of a thermoelectric conversion material formed just before formation thereof, and the resultant coating film is dried to give a thin film of the thermoelectric conversion material of the third layer and the subsequent layers. The process is repeated desired times to give a chip of a thermoelectric conversion material having a desired thickness.

According to the multilayer printing method, a chip of a thermoelectric conversion material having good shape controllability can be produced.

(Pattern Frame Placing/Peeling Method)

A pattern frame placing/peeling method is a method of placing, on a substrate, a pattern frame having openings spaced from each other, then filling the openings with a thermoelectric semiconductor composition, drying the composition, and peeling the pattern frame from the substrate to form a chip of a thermoelectric conversion material having excellent shape controllability, in which the shape of the opening of the pattern frame is reflected on the chip. Not specifically limited, the shape of the opening includes a rectangular parallelepiped, a cube and a column.

The production process incudes a step of providing a pattern frame having openings on a substrate, a step of filling the openings with a thermoelectric semiconductor composition, a step of drying the thermoelectric semiconductor composition filled in the openings to form chips of the thermoelectric semiconductor composition and a step of peeling the pattern frame from the substrate.

One example of the process for producing a chip of a thermoelectric conversion material according to the pattern frame placing/peeling method is specifically described with reference to a drawing.

Figure 5:
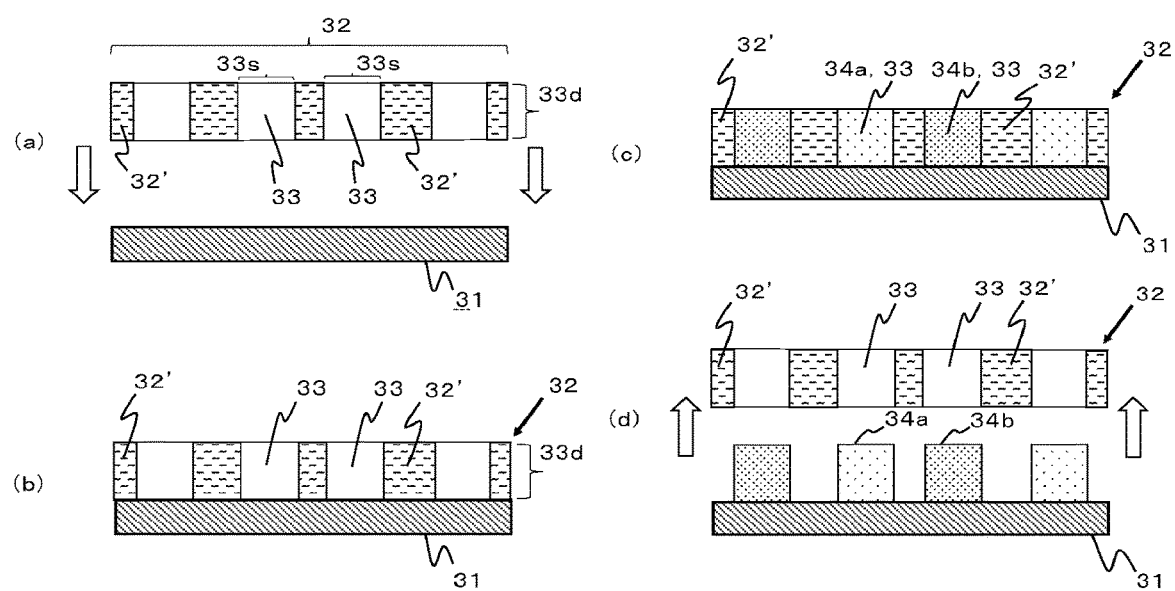
FIG. 5 is an explanatory view showing a flow of an example of a method for producing a chip of a thermoelectric conversion material according to a pattern frame placing/peeling method used in the present invention.

FIG. 5 is an explanatory view showing a flowchart of an example of a method for producing a chip of a thermoelectric conversion material according to a pattern frame placing/peeling method used in the present invention.

(a) is a cross-sectional view showing an embodiment of a pattern frame facing a substrate, in which a pattern frame 32 of a stainless steel 32', having an aperture 33s, an opening 33 and an opening depth (pattern frame thickness) 33d, is prepared and set to face a substrate 31;

(b) is a cross-sectional view after the pattern frame has been set on the substrate, in which the pattern frame 32 is set on the substrate 31;

(c) is a cross-sectional view after the openings of the pattern frame have been filled with a thermoelectric semiconductor composition, in which the openings 33 each having the aperture 33s of the pattern frame 32 of a stainless steel 32' prepared in (b) are filled with a thermoelectric semiconductor composition containing a P-type thermoelectric semiconductor material and a thermoelectric semiconductor composition containing an N-type thermoelectric semiconductor material individually in predetermined openings 33, and the thermoelectric semiconductor composition containing a P-type thermoelectric semiconductor material and the thermoelectric semiconductor composition containing an N-type thermoelectric semiconductor material charged in the openings 33 are dried to form a chip 34b of a P-type thermoelectric conversion material and a chip 34a of an N-type thermoelectric conversion material;

(d) is a cross-sectional view showing an embodiment of peeling the pattern frame from the formed chips of a thermoelectric conversion material to give the chips of a thermoelectric conversion material alone, in which the pattern frame 32 is peeled from the formed chips 34b of a P-type thermoelectric conversion material and the formed chips 34a of an N-type thermoelectric conversion material to thereby give the chips 34b of a P-type thermoelectric conversion material and the chips 34a of an N-type thermoelectric conversion material all as self-standing chips.

According to the above, chips of a thermoelectric conversion material can be formed.

In that manner, according to the pattern frame placing/peeling method, chips of a thermoelectric conversion material having good shape controllability can be formed.

The drying method for the resultant coating film (thin film) is as mentioned above.

The heating temperature in the case where a solvent is used in preparing the thermoelectric semiconductor composition is also as mentioned above.

Not specifically limited, the thickness of the thin film of a thermoelectric semiconductor composition is, from the viewpoint of thermoelectric performance and film strength, preferably 100 nm to 1000 μm, more preferably 300 nm to 600 μm, even more preferably 5 to 400 μm.

(C) Annealing Step

The annealing step is a step of forming a chip of a thermoelectric conversion material on a sacrificial layer and then heat-treating the chip of a thermoelectric conversion material at a predetermined temperature in a state having the sacrificial layer on the substrate.

For example, in FIG. 1, this is a step of annealing the chip 3 of a thermoelectric conversion material of a thermoelectric semiconductor composition on the sacrificial layer 2.

The chip of a thermoelectric conversion material is, after formed as a thin film, annealed. The annealing treatment can stabilize thermoelectric performance and can achieve crystal growth of the thermoelectric semiconductor fine particles in the thin film, therefore further stabilizing thermoelectric performance.

Not specifically limited, the annealing treatment is generally carried out in an inert gas atmosphere of nitrogen, argon or the like or a reducing gas atmosphere in which the gas flow rate is controlled, or in vacuum, and depending on the upper-temperature limit of the heat-resistant resin, the ionic liquid and the inorganic ionic compound to be used and also the resin and the release agent for the sacrificial layer, the annealing treatment is carried out generally at 100 to 600° C. for a few minutes to several tens of hours, preferably at 150 to 600° C. for a few minutes to several tens of hours, more preferably at 250 to 600° C. for a few minutes to several tens of hours, even more preferably at 250 to 460° C. for a few minutes to several tens of hours.

(D) Chip Peeling Step

The thermoelectric conversion material chip peeling step is a step of peeling the chip of a thermoelectric conversion material from the sacrificial layer after the chip of a thermoelectric conversion material has been annealed.

The chip annealing method is not specifically limited so far as it is a method capable of peeling the chip of a thermoelectric conversion material from the sacrificial layer after the chip of a thermoelectric conversion material has been annealed, and plural chips of a thermoelectric conversion material may be peeled from the sacrificial layer in the form of individually separated chips, or may be peeled in the form of plural chips all at a time.

In the method of producing a chip of a thermoelectric conversion material of the present invention, preferably, the step (D) includes (D-1) a step of peeling the chip of a thermoelectric conversion material annealed in the step (C) from the sacrificial layer and transferring it to a pressure-sensitive adhesive layer of a pressure-sensitive adhesive sheet, and (D-2) a step of lowering the adhesive strength of the pressure-sensitive adhesive layer to peel the chip of a thermoelectric conversion material transferred in the step (D-1), from the pressure-sensitive adhesive layer.

Figure 3:
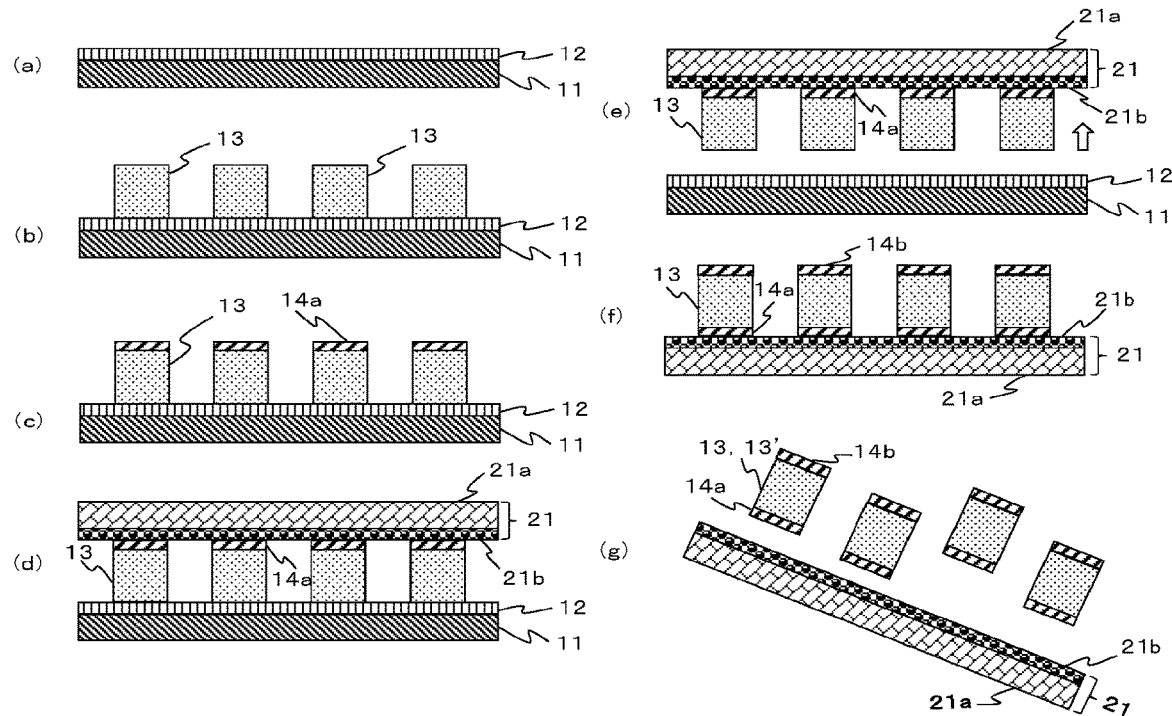
FIG. 3 is an explanatory view showing a flow of an example of a process according to a method for producing a chip of a thermoelectric conversion material of the present invention.

FIG. 3 is an explanatory view showing a flowchart of an example of a step according to a method for producing a chip of a thermoelectric conversion material of the present invention, in which (a) is a cross-sectional view after the sacrificial layer 12 is formed on the substrate 11, (b) is a cross-sectional view after the patterned chip 13 of a thermoelectric conversion material is formed on the sacrificial layer 12 and then annealed, (c) is a cross-sectional view after a solder-receiving layer 14a to be mentioned below is formed on the chip 13 of a thermoelectric conversion material, (d) is a cross-sectional view after the chip 13 of a thermoelectric conversion material is attached to a pressure-sensitive adhesive layer 21b on a substrate 21a of a pressure-sensitive adhesive sheet 21, via the solder-receiving layer 14a, (e) is a cross-sectional view showing an embodiment of peeling the chip 13 of a thermoelectric conversion material from the sacrificial layer 12 and transferring the chip 13 of a thermoelectric conversion material to the pressure-sensitive adhesive layer 21b, (f) is a cross-sectional view after a solder-receiving layer 14b to be mentioned below is formed similarly to (c) on the surface opposite to the surface of the sacrificial layer side of the chip 13 of a thermoelectric conversion material formed in (e), and (g) is a cross-sectional view showing an embodiment of lowering the adhesive strength of the pressure-sensitive adhesive layer 21b and then peeling the chip 13 of a thermoelectric conversion material having the solder-receiving layers 14a and 14b on both surfaces of the chip 13 of a thermoelectric conversion material formed in the step (f), from the pressure-sensitive adhesive layer 21b as chips (individual chips) 13' of the thermoelectric conversion material.

(D-1) Thermoelectric Conversion Material Chip Transferring Step

Preferably, the method for producing a chip of a thermoelectric conversion material of the present invention includes a thermoelectric conversion material chip transferring step.

In the thermoelectric conversion material chip transferring step, preferably, a pressure-sensitive adhesive sheet, namely, a sheet material having a pressure-sensitive adhesive layer formed of a pressure-sensitive adhesive composition on a substrate (hereinafter this may be referred to as a "dicing tape"), is used, for the purpose of readily peeling the transferred chip of a thermoelectric conversion material as an individual chip of a thermoelectric conversion material. The pressure sensitive adhesive composition contains the pressure sensitive adhesive as main component.

The thermoelectric conversion material chip transferring step is a step of transferring the chip of a thermoelectric conversion material on the sacrificial layer, after annealed, onto a pressure-sensitive adhesive layer, and for example, as in FIG. 3(d), the pressure-sensitive adhesive layer 21b on the substrate 21a to constitute the pressure-sensitive adhesive sheet 21 is bonded to the chip 13 of a thermoelectric conversion material via the solder-receiving layer 14a to be mentioned blow, and then, as in FIG. 3(e), the chip 13 of a thermoelectric conversion material is peeled from the sacrificial layer 12 and the chip 13 of a thermoelectric conversion material is transferred to the pressure-sensitive adhesive layer 21b via the solder-receiving layer 14a.

The method of bonding the chip of a thermoelectric conversion material to the pressure-sensitive adhesive layer is not specifically limited, and can be carried out according to a known technique.

The sacrificial layer peeling method is not also specifically limited so far as, in the method, the annealed chip of a thermoelectric conversion material can be peeled from a release layer in a state maintaining the shape and the properties thereof and the method can be carried out according to a known technique.

(Pressure-Sensitive Adhesive Layer)

The pressure-sensitive adhesive layer for use in the present invention preferably satisfies the following requirements (s), (t) and (u), from the viewpoint of transferring a chip of a thermoelectric conversion material, and from the viewpoint of readily peeling the transferred chip of a thermoelectric conversion material as a chip of a thermoelectric conversion material.

(s) The adhesive strength before treatment for adhesive strength reduction of the pressure-sensitive adhesive layer to a mirror surface of a silicon wafer is 1.0 N/25 mm or more.

(t) The adhesive strength after treatment for adhesive strength reduction of the pressure-sensitive adhesive layer to a mirror surface of a silicon wafer is less than 1.0 N/25 mm.

(u) The ratio of the thickness of the pressure-sensitive adhesive layer to the thickness of the chip of a thermoelectric conversion material is 5/100 to 70/100.

Here, the adhesive strength is a value measured under the condition of a peeling speed of 300 mm/min and a peeling angle of 180 degrees, according to a method stipulated in JISZ-0237.

Regarding the requirement (s), the adhesive strength before treatment for adhesive strength reduction of the pressure-sensitive adhesive layer to a mirror surface of a silicon wafer is more preferably 1.5 to 50 N/25 mm or more, even more preferably 2.0 to 20 N/25 mm. When the adhesive strength of the pressure-sensitive adhesive layer falls within the range, the chip of a thermoelectric conversion material can be readily peeled from the sacrificial layer and the chip of a thermoelectric conversion material can be readily transferred to the pressure-sensitive adhesive layer. When the adhesive strength is more than 50 N/25 mm, the adhesive strength of the pressure-sensitive adhesive layer could not be reduced to less than 1.0 N/25 mm, as the case may be.

Regarding the requirement (t), the adhesive strength after treatment for adhesive strength reduction of the pressure-sensitive adhesive layer to a mirror surface of a silicon wafer is more preferably 0.01 to 0.20 N/25 mm, even more preferably 0.05 to 0.15 N/25 mm. When the adhesive strength of the pressure-sensitive adhesive layer falls within the range, the chip of a thermoelectric conversion material can be readily peeled from the pressure-sensitive adhesive layer and the chip of a thermoelectric conversion material can be readily obtained as individual chips.

Further, regarding the requirement (u), the ratio of the thickness of the pressure-sensitive adhesive layer to the thickness of the chip of a thermoelectric conversion material is more preferably 10/100 to 30/100, even more preferably 15/100 to 25/100. When the ratio of the thickness of the pressure-sensitive adhesive layer to the thickness of the chip of a thermoelectric conversion material falls within the range and when the adhesive strength after the step of treatment for adhesive strength reduction of the pressure-sensitive adhesive layer to a mirror surface of a silicon wafer satisfies the requirement (t), the chip of a thermoelectric conversion material can be readily peeled from the pressure-sensitive adhesive layer and the chip of a thermoelectric conversion material can be readily obtained as individual chips.

Not specifically limited, the pressure-sensitive adhesive layer satisfying (s), (t) and (u) may be formed of a known pressure-sensitive adhesive, and for example, may be formed of a rubber-based, acrylic or silicone-based pressure-sensitive adhesive or may also be formed of a thermoplastic elastomer such as a styrene-based elastomer or an olefin-based elastomer. Among these, an acrylic pressure-sensitive adhesive is preferably employed.

The acrylic pressure-sensitive adhesive may be a homopolymer of an acrylate compound or may be a copolymer of an acrylate compound and a comonomer. Examples of the acrylate compound include methyl acrylate, ethyl acrylate, butyl acrylate and 2-ethylhexyl acrylate. Examples of the comonomer to constitute the acrylic copolymer include vinyl acetate, acrylonitrile, acrylamide, styrene, methyl (meth)acrylate, (meth)acrylic acid, hydroxyethyl methacrylate, dimethylaminoethyl methacrylate, glycidyl methacrylate and maleic anhydride.

In the present invention, the pressure-sensitive adhesive layer preferably contains an energy ray-curable pressure-sensitive adhesive capable of reducing adhesive strength by energy ray, a thermally-curable pressure-sensitive adhesive capable of reducing adhesive strength by heating or a thermally foaming pressure-sensitive adhesive, from the viewpoint of process simplicity. Further, the energy ray-curable pressure-sensitive adhesive is more preferably a UV-curable pressure-sensitive adhesive.

The UV-curable pressure-sensitive adhesive contains a pressure-sensitive adhesive such as the above-mentioned acrylic pressure-sensitive adhesive and a photopolymerization initiator, and the thermally-curable pressure-sensitive adhesive contains a pressure-sensitive adhesive such as the above-mentioned acrylic pressure-sensitive adhesive and a thermal polymerization initiator, and as needed, these pressure-sensitive adhesives may further contain a curable compound (component having a carbon-carbon double bond) and a crosslinking agent.

The photopolymerization initiator may be any compound capable of being cleaved by irradiation with UV rays to form a radical, and examples thereof include benzoin alkyl ethers such as benzoin methyl ether, benzoin isopropyl ether, and benzoin isobutyl ether; aromatic ketones such as benzil, benzoin, benzophenone, and α-hydroxycyclohexyl phenyl ketone; and aromatic ketals such as benzyl dimethyl ketal.

The thermal polymerization initiator includes an organic peroxide derivative and an azo-type polymerization initiator, and is preferably an organic peroxide derivative not generating nitrogen in heating. Examples of the organic peroxide derivative include ketone peroxides, peroxyketals, hydroperoxides, dialkyl peroxides, and diacyl peroxides.

The curable compound may be a monomer, an oligomer or a polymer having a carbon-carbon double bond in the molecule and curable by radical polymerization. Examples of the curable compound include esters of a (meth)acrylic acid and a polyalcohol, such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate. In the case where the pressure-sensitive adhesive is a UV-curable polymer having a carbon-carbon double bond in the side chain, it is not always necessary to add a curable compound thereto.

The content of the curable compound is preferably 5 to 900 parts by mass relative to 100 parts by mass of the pressure-sensitive adhesive, more preferably 20 to 200 parts by mass. When the content of the curable compound falls within the range, adhesive strength control can be sufficient and storage stability can be maintained without too much sensitivity increase to heat and light.

The crosslinking agent includes epoxy compounds such as pentaerythritol polyglycidyl ether; and isocyanate compounds such as tetramethylene diisocyanate, hexamethylene diisocyanate and polyisocyanate.

Any thermally foaming pressure-sensitive adhesive that can expand and peel by the action of a foaming agent and an expansive agent is usable with no specific limitation, and examples thereof include a thermally-expansive microscopic spheres-containing pressure-sensitive adhesive such that the thermally-expansive microscopic spheres blended in the pressure-sensitive adhesive expand at a predetermined temperature whereby the surface of the pressure-sensitive adhesive irregularly deforms to greatly lower the adhesive strength of the pressure-sensitive adhesive. Examples of the thermally-expansive microscopic spheres having such a function include Microsphere (registered trademark by Matsumoto Yushi-Seiyaku Co., Ltd.).

The glass transition temperature (Tg) of the pressure-sensitive adhesive layer is preferably −50 to 30° C., more preferably −25 to 30° C. Here, Tg of the pressure-sensitive adhesive layer indicates a temperature at which the loss tangent (tan δ) of a sample laminated with the pressure-sensitive adhesive layer shows a maximum value in a region of −50 to 50° C. at a frequency of 11 Hz in kinematic viscoelastometry. In the case where the pressure-sensitive adhesive layer is of an energy ray-curable pressure-sensitive adhesive, the glass transition temperature is a value before the pressure-sensitive adhesive layer is cured by energy ray irradiation. In the case where the pressure-sensitive adhesive layer is of an acrylic pressure-sensitive adhesive, the glass transition temperature of the pressure-sensitive adhesive layer can be controlled by controlling the kind of the monomers to constitute the acrylic pressure-sensitive adhesive and controlling the polymerization ratio thereof, and by estimating the influence of the UV-curable compound and the crosslinking agent that may be optionally added thereto.

Examples of the other components that may be contained in the pressure-sensitive adhesive composition include various additives that may be optionally added to the composition, such as a tackifier (e.g., rosin derivative resins, polyterpene resins, petroleum resins, oil-soluble phenolic resins), a thickener, a plasticizer, a filler, a foaming agent, an antiaging agent, an antioxidant, a UV absorbent, an antistatic agent, a surfactant, a leveling agent, a colorant, a flame retardant, and a silane coupling agent.

Using the pressure-sensitive adhesive facilitates transfer of chips of a thermoelectric conversion material in the thermoelectric conversion material chip transferring step, and in the thermoelectric conversion material chip peeling step to be mentioned hereinunder, by giving energy of UV rays or heat, the adhesive strength between the pressure-sensitive adhesive layer and the chip of a thermoelectric conversion material is lowered to facilitate peeling of chips of a thermoelectric conversion material, and the chips of a thermoelectric conversion material can be thus readily obtained.

Preferably, the thickness of the pressure-sensitive adhesive layer satisfies the above-mentioned requirement (u) depending on the thickness of the chip of a thermoelectric conversion material. In general, the thickness is 3 to 100 μm, preferably 5 to 80 μm.

(Substrate)

The substrate for the pressure-sensitive adhesive of the pressure-sensitive adhesive sheet for use in the present invention includes polyolefin-based films such as polyethylene films such as low-density polyethylene (LDPE) films, linear low-density polyethylene (LLDPE) films and high-density polyethylene (HDPE) films, polypropylene films, ethylene-propylene copolymer films, polybutene films, polybutadiene films, polymethylpentene films, ethylene-norbornene copolymer films, and norbornene resin films; ethylene-based copolymer films such as ethylene-vinyl acetate copolymer films, ethylene-(meth)acrylic acid copolymer films, and ethylene-(meth)acrylate copolymer films; polyvinyl chloride-based films such as polyvinyl chloride films, and vinyl chloride copolymer films; polyester-based films such as polyethylene terephthalate films, and polybutylene terephthalate films; polyurethane films; polyimide films; polystyrene films; polycarbonate films; and fluororesin films. Also usable here are modified films such as crosslinked films and ionomer films. Further, the substrate may also be a laminate film prepared by laminating a plurality of the above-mentioned films. In this description, "(meth) acrylic acid" means both acrylic acid and methacrylic acid. The same applied to the other similar terms.

In the case where the substrate is a laminate film, for example, it is preferable that a film whose arithmetic average roughness varies before and after heating is arranged on the back side of the substrate, and a film which is resistant to heat and does not deform even at a high temperature is arranged on the side of the pressure-sensitive adhesive layer of the substrate.

Among the above, polyolefin-based films are preferred, and in particular, polyethylene films, polypropylene films and ethylene-propylene copolymer films are preferred, and further ethylene-propylene copolymer films are preferred. These resin films can readily satisfy the above-mentioned properties and in particular, ethylene-propylene copolymer films can be readily made to satisfy the above-mentioned properties by controlling the copolymerization ratio of the ethylene monomer and the propylene monomer. These resin films are also preferred from the viewpoint of workpiece adhesion operability and chip peelability.

If desired, the resin film may be surface-treated according to an oxidation method or a surface roughening method or may be primer-treated on one surface or both surfaces thereof, for the purpose of improving the adhesiveness between the film and the pressure-sensitive adhesive layer to be laminated thereon. Examples of the oxidation method include corona discharge treatment, plasma discharge treatment, chromium oxidation treatment (wet process), flame treatment, hot air treatment, and ozone or UV ray irradiation treatment. Examples of the surface roughening method include a sandblasting method and a thermal spraying treatment.

The substrate may contain various additives, such as a colorant, a flame retardant, a plasticizer, an antistatic agent, a lubricant and a filler, in the resin film.

Not specifically limited, the thickness of the substrate is preferably 20 to 450 µm, more preferably 25 to 400 µm, even more preferably 50 to 350 µm.

(D-2) Thermoelectric Conversion Material Chip Peeling Step

The production method for a chip of a thermoelectric conversion material of the present invention preferably includes a thermoelectric conversion material chip peeling step. The thermoelectric conversion material chip peeling step is a step of lowering the adhesive strength of the above-mentioned pressure-sensitive adhesive layer to peel the chip of a thermoelectric conversion material transferred in the step (D-1), from the pressure-sensitive adhesive layer to give individual chips of a thermoelectric conversion material. For example, according to the step as in FIG. 3(f), the adhesive strength of the pressure-sensitive adhesive layer is lowered, and the chip 13 of a thermoelectric conversion material having the solder-receiving layers 14a and 14b on both surfaces thereof is peeled from the pressure-sensitive adhesive layer 21b via the solder-receiving layer 14a to give the chips (individual chips) 13' of a thermoelectric conversion material.

Regarding the method of lowering the adhesive strength of the pressure-sensitive adhesive layer, the pressure-sensitive adhesive layer containing an adhesive whose adhesive strength is lowered by irradiation with heat or energy rays is, before chip peeling, irradiated with heat or energy rays to thereby lower the adhesive strength thereof to the chip of a thermoelectric conversion material.

The energy ray incudes an ionizing radiation, that is, UV rays, electron beams and X rays. Among these, from the viewpoint of cost, safety and easiness in equipment installation, UV rays are preferred.

In the case where UV rays are used as the energy ray, near-UV rays including UV rays having a wavelength of 200 to 380 nm or so are preferably used from the viewpoint of easy operability. The light quantity may be appropriately selected depending on the kind of the energy ray-curable component contained in the pressure-sensitive adhesive composition and on the thickness of the pressure-sensitive adhesive layer, and is generally 50 to 500 mJ/cm$^2$ or so, preferably 100 to 450 mJ/cm$^2$, more preferably 200 to 400 mJ/cm$^2$. The UV illumination is generally 50 to 500 mW/cm$^2$ or so, preferably 100 to 450 mW/cm$^2$, more preferably 200 to 400 mW/cm$^2$. The UV ray source is not specifically limited, and examples thereof include a high-pressure mercury lamp, a metal halide lamp and a UV-LED.

In the case where electron beams are used as the energy ray, the acceleration voltage thereof may be appropriately selected depending on the kind of the energy ray-curable component contained in the pressure-sensitive adhesive composition and on the thickness of the pressure-sensitive adhesive layer, and in general, the acceleration voltage is preferably 10 to 1000 kV or so. The irradiation dose may be set to fall within a range within which the pressure-sensitive adhesive can cure, and in general, it is selected to fall within a range of 10 to 1000 krad. The electron beam source is not specifically limited, and examples thereof include various electron beam accelerators such as a Cockroft-Walton's accelerator, a Van de Graaff accelerator, a resonance transformer, an insulation core transformer, or a linear, dynamitron or high-frequency accelerator.

The method of peeling the chip of a thermoelectric conversion material from the pressure-sensitive adhesive layer is not specifically limited, and the chip may be peeled according to a known method.

(Solder-Receiving Layer Forming Step)

Preferably, the present invention further includes a solder-receiving layer forming step for providing a solder-receiving layer on the annealed chip of a thermoelectric conversion material and/or on the surface of the chip of a thermoelectric conversion material opposite to the surface thereof transferred to the pressure-sensitive adhesive layer, from the viewpoint of improving the bonding strength of the resultant chip of a thermoelectric conversion material to the solder material layer on an electrode.

The solder-receiving layer forming step is, for example, a step as in FIG. 3(c), in which the solder-receiving layer 14a is formed on the chip 13 of a thermoelectric conversion material, or a step as in FIG. 3(f), in which the solder-receiving layer 14b is formed on the chip 13 of a thermoelectric conversion material.

The solder-receiving layer preferably contains a metal material. The metal material is preferably at least one selected from gold, silver, rhodium, platinum, chromium, palladium, tin, and an alloy containing any of these metal materials. Among these, gold, silver, or a two-layer structure of tin and gold is more preferred, and from the viewpoint of material cost, high thermal conductivity and bonding stability, silver is even more preferred.

Further, the solder-receiving layer may also be formed using a paste material that contains a solvent and a resin component, in addition to the metal material. In the case of using a paste material, preferably, the solvent and the resin component are removed by firing or the like, as described below. As the paste material, a silver paste or an aluminum paste is preferred. In addition, a metal resinate material can also be used as the solder-receiving layer.

The thickness of the solder-receiving layer is preferably 10 nm to 50 µm, more preferably 50 nm to 16 µm, even more preferably 200 nm to 4 µm, especially more preferably 500 nm to 3 µm. When the thickness of the solder-receiving layer falls within the range, the adhesiveness to the surface of the chip of a thermoelectric conversion material containing a resin and the adhesiveness to the surface of the solder material layer on the electrode side are excellent and high-reliability bonding can be attained. In addition, not only electroconductivity but also thermal conductivity can be kept high, therefore resulting in that the thermoelectric performance of the thermoelectric conversion module is not lowered and is kept good.

The solder-receiving layer may be a single layer of the above-mentioned metal material used directly as such, or two or more metal materials may be laminated to be a multilayer. Also, a composition containing the metal material in a solvent or a resin may be used for forming the layer. However, in this case, from the viewpoint of maintaining high electroconductivity and high thermal conductivity (maintaining thermoelectric performance), preferably, the resin component including a solvent is removed by firing as the final form of the solder-receiving layer.

The solder-receiving layer is formed using the above-mentioned metal material.

As a method for forming a solder-receiving layer as a pattern, employable herein is a method that includes forming an unpatterned solder-receiving layer on a chip of a thermoelectric conversion material, and then patterning the layer to have a predetermined pattern by known physical treatment or chemical treatment or a combination thereof mainly based on photolithography, or a method of directly forming a pattern of a solder-receiving layer according to a screen printing method, a stencil printing method or an inkjet method.

As a method for forming a solder-receiving layer that does not require patterning, employable herein is a vacuum film formation method such as PVD (physical vapor deposition) such as a vacuum evaporation method, a sputtering method, or an ion-plating method, or CVD (chemical vapor deposition) such as thermal CVD or atomic layer deposition (ALD), or a wet process of various coating or electrodeposition methods such as a dip coating method, a spin coating method, a spray coating method, a gravure coating method, a the coating method or a doctor blade method, as well as a silver salt method, an electrolytic plating method, an electroless plating method, or lamination of metal foils; and the method may be appropriately selected depending on the material of the solder-receiving layer.

In the present invention, the solder-receiving layer is required to have high electroconductivity and high thermal conductivity from the viewpoint of maintaining thermoelectric performance, and therefore a solder-receiving layer formed according to a screen printing method, a stencil printing method, an electrolytic plating method, an electroless plating method or a vacuum film formation method is preferably used.

According to the production method for a chip of a thermoelectric conversion material of the present invention, a chip of a thermoelectric conversion material can be produced in a simple manner. In the method, the thermoelectric semiconductor material to constitute a thermoelectric conversion material is annealed at an optimum annealing temperature while the thermoelectric conversion material is in a state not having a junction to an electrode, and accordingly, the method is free from a problem of increasing the electric resistance value between the thermoelectric conversion material and an electrode to degrade thermoelectric performance.

[Production Method for Thermoelectric Conversion Module]

The production method for a thermoelectric conversion module of the present invention is a method for producing a thermoelectric conversion module of a combination of plural chips of a thermoelectric conversion material produced in the above-mentioned production method for a chip of a thermoelectric conversion material.

Preferably, from the viewpoint of thermoelectric performance, the thermoelectric conversion module is produced in such a manner that chips of a P-type thermoelectric conversion material and chips of an N-type thermoelectric conversion materials are mounted (arranged) so as to be connected via an electrode to have a configuration of a π-type or in-plane type thermoelectric conversion module.

In the case of configuring a π-type thermoelectric conversion module, for example, a pair of electrodes spacing from each other are provided on a substrate, a chip of a P-type thermoelectric conversion material is arranged on one electrode and a chip of an N-type thermoelectric conversion material is on the other electrode similarly as space from each other, and the upper faces of those chips of a thermoelectric conversion material are electrically connected in series to the electrode on a facing substrate, and hence, the intended module is configured. From the viewpoint of efficiently attaining high-level thermoelectric performance, preferably, plural pairs of a chip of a P-type thermoelectric conversion material and a chip of a N-type thermoelectric conversion material, each combined via the electrode on the facing substrate, are electrically connected in series (see FIG. 4(g) to be mentioned below).

One preferred embodiment of the method for producing a π-type thermoelectric conversion module of a combination of plural chips of a thermoelectric conversion material produced in the production method for a chip of a thermoelectric conversion material of the present invention includes the following steps (I) to (VI).

(I) a step of forming a first electrode on a first resin film, (II) a step of forming a second electrode on a second resin film, (III) a step of forming a bonding material layer 1 on the first electrode formed in the step (I), (IV) a step of mounting one surface of the chip of a thermoelectric conversion material on the bonding material layer 1 formed in the step (III), (V) a step of bonding one surface of the chip of a thermoelectric conversion material mounted in the step (IV) to the first electrode via the bonding material layer 1 formed in the step (III), and (VI) a step of bonding the other surface of the chip of a thermoelectric conversion material after the step (V) to the second electrode formed in the step (II) via a bonding material layer 2.

One preferred embodiment of the method for producing a π-type thermoelectric conversion module of a combination of plural chips of a thermoelectric conversion material each having a solder-receiving layer as produced in the production method for a chip of a thermoelectric conversion material of the present invention includes the following steps (XI) to (XVI).

(XI) a step of forming a first electrode on a first resin film, (XII) a step of forming a second electrode on a second resin film, (XIII) a step of forming a solder material layer on the first electrode formed in the step (XI), (XIV) a step of mounting one surface of the chip of a thermoelectric conversion material having a solder-receiving layer on the solder material layer formed in the step (XIII), (XV) a step of bonding one surface of the chip of a thermoelectric conversion material having a solder-receiving layer mounted in the step (XIV) to the first electrode via the solder material layer formed in the step (XIII), and (XVI) a step of bonding the solder-receiving layer on the other surface of the chip of a thermoelectric conversion material after the step (XV) to the second electrode formed in the step (XII) via the solder material layer.

Hereinunder the production method for a thermoelectric conversion module using the chip of a thermoelectric conversion material produced according to the production method for a chip of a thermoelectric conversion material of the present invention is described with reference to drawings.

Figure 4:
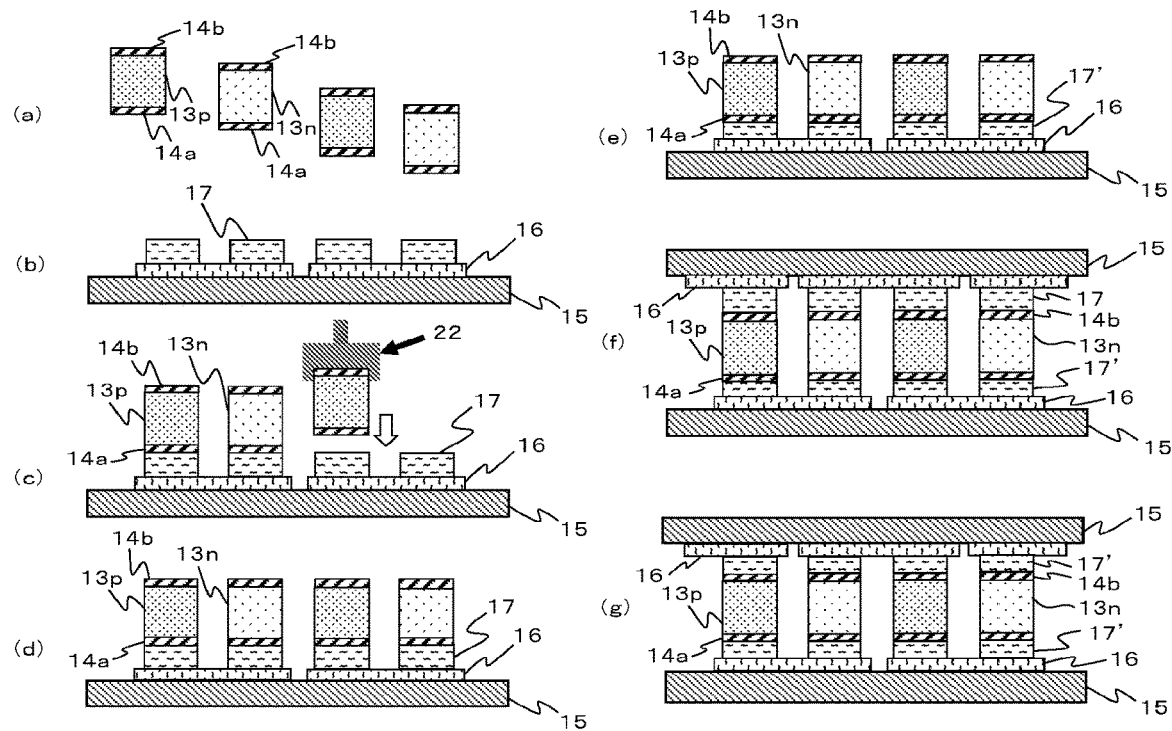
FIG. 4 is an explanatory view showing a flow of an example of a process according to a method for producing a thermoelectric conversion module using a chip of a thermoelectric conversion material produced according to a method for producing a chip of a thermoelectric conversion material of the present invention.

FIG. 4 is an explanatory view showing a flowchart of an example of a step according to a method for producing a thermoelectric conversion module using the chip of a thermoelectric conversion material produced according to the method for producing a chip of a thermoelectric conversion material of the present invention, in which (a) is a cross-sectional view of a chip 13*p* of a P-type thermoelectric conversion material and a chip 13*n* of an N-type thermoelectric conversion material each having solder-receiving layers 14*a* and 14*b* on both surfaces thereof produced according to the production method for a chip of the thermoelectric conversion material to be mentioned above; (b) is a cross-sectional view after an electrode 16 and a solder material layer 17 are formed on a resin film 15; (c) is a cross-sectional view showing an embodiment of mounting the chip 13*p* of a P-type thermoelectric conversion material and the chip 13*n* of an N-type thermoelectric conversion material each having the solder-receiving layer 14*a*, on the solder material layer 17 on the electrode 16 on the resin film 15 formed in (b); (d) is a cross-sectional view showing an embodiment after the chip 13*p* of a P-type thermoelectric conversion material and the chip 13*n* of an N-type thermoelectric conversion material are mounted; (e) shows an embodiment after heating, cooling and bonding the solder material layer 17 (solder material layer 17'); (f) is a cross-sectional view after the solder material layer 17 on the electrode 16 of the resin film 15 formed in (b) is bonded to the solder-receiving layer 14*b* of the chip 13*p* of a P-type thermoelectric conversion material and the chip 13*n* of an N-type thermoelectric conversion material; and (g) is a cross-sectional view after the chip 13*p* of a P-type thermoelectric conversion material and the chip 13*n* of an N-type thermoelectric conversion material each having the solder-receiving layers 14*a* and 14*b* are bonded to the electrode 16, by heating and cooling the solder material layer 17 used in (f).

<Electrode Forming Step>

The electrode forming step is a step of the production method for a thermoelectric conversion module of the present invention, for example, a step of forming a first electrode on a first resin film in the above step (I), or for example, a step of forming a second electrode on a second resin film in the above step (II), or for example, a step of forming a metal layer on a resin film 15 and patterning the layer in a predetermined manner to form an electrode 16 in FIG. 4(*b*).

(Resin Film)

In the production method for a thermoelectric conversion module of the present invention, preferably, a first resin film and a second resin film not having any influence on reduction in the electrical conductivity of a thermoelectric conversion material and on increase in thermal conductivity are used. Above all, from the viewpoint of excellent flexibility and high-level heat resistance and dimensional stability in that, even in annealing of a thin film of a thermoelectric semiconductor composition, chip performance of a thermoelectric conversion material can be maintained without causing substrate deformation, the resin film is each independently preferably a polyimide film, a polyamide film, a polyether imide film, a polyaramid film, or a polyamideimide film, and from the viewpoint of high-level general versatility, a polyimide film is especially preferred.

The thickness of the first resin film and the second resin film is, from the viewpoint of flexibility, heat resistance and dimensional stability, each independently preferably 1 to 1000 μm, more preferably 5 to 500 μm, and even more preferably 10 to 100 μm.

Also preferably, the 5% weight-loss temperature of the first resin film and the second resin film, as measured in thermogravimetry, is 300° C. or higher, more preferably 400° C. or higher. Also preferably, the rate of dimensional change in heating thereof, as measured at 200° C. according to JIS K7133 (1999), is 0.5% or less, more preferably 0.3% or less. Also preferably, the linear expansion coefficient in the in-plane direction thereof, as measured according to JIS K7197 (2012), is 0.1 ppm·° $C.^{-1}$ to 50 ppm·° $C.^{-1}$, more preferably 0.1 ppm·° $C.^{-1}$ to 30 ppm·° $C.^{-1}$.

(Electrode)

The metal material for the first electrode and the second electrode in the thermoelectric conversion module of the present invention is copper, gold, nickel, aluminum, rhodium, platinum, chromium, palladium, stainless steel, molybdenum or an alloy containing any of these metals.

The thickness of the electrode layer is preferably 10 nm to 200 μm, more preferably 30 nm to 150 μm, even more preferably 50 nm to 120 μm. When the thickness of the electrode layer falls within the range, the electrical conductivity thereof can be high and the resistance can be low and the electrode layer can have a sufficient strength.

For electrode formation, the above-mentioned metal material is used.

For the electrode formation method, employable is a method that includes forming an unpatterned electrode on a resin film, and then patterning it to have a predetermined pattern by known physical treatment or chemical treatment or a combination thereof mainly based on photolithography, or a method of directly forming a pattern of an electrode according to a screen printing method, or an inkjet method.

As the method for forming an unpatterned electrode, employable is a dry process such as PVD (physical vapor deposition) such as a vacuum evaporation method, a sputtering method, or an ion-plating method, or CVD (chemical vapor deposition) such as thermal CVD or atomic layer deposition (ALD), or a wet process of various coating or electrodeposition methods such as a dip coating method, a spin coating method, a spray coating method, a gravure coating method, a die coating method or a doctor blade method, as well as a silver salt method, an electrolytic plating method, an electroless plating method, or lamination of metal foils; and the method may be appropriately selected depending on the material of the electrode.

The electrode for use in the present invention is required to have high electroconductivity and high thermal conductivity from the viewpoint of maintaining thermoelectric performance, and is therefore preferably an electrode formed according to a plating method or a vacuum film formation method. Also preferred is an electrode formed according to a vacuum film formation method such as a vacuum evaporation method or a sputtering method, or an electrolytic plating method or an electroless plating method, as readily realizing high electroconductivity and high thermal conductivity. Depending on the dimension of the pattern to be formed and on the dimensional accuracy thereof, a pattern can be formed with ease via a hard mask such as a metal mask.

<Bonding Material Layer Forming Step>

The bonding material layer forming step is, for example, the step (III) in the production method for a thermoelectric conversion module of the present invention, and is a step of forming a bonding material layer 1 on the first electrode. Also for example, the step is included in the step (VI) and is a step of forming a bonding material layer 2 on the second electrode.

Specifically, for example, as in FIG. 4(b), this is a step of forming a solder material layer 17 on the electrode 16, and the bonding material layer 1 and the bonding material layer 2 are for boding a chip of a thermoelectric conversion material to an electrode.

The bonding material includes a solder material, an electroconductive adhesive, and a sintering bond, and is preferably formed as a solder material layer, an electroconductive adhesive layer and a sintering bond layer, respectively, on an electrode. In this description, electroconductivity is meant to indicate that the electric resistivity is less than $1\times10^6$ Ω·m.

The solder material to constitute the solder layer may be appropriately selected in consideration of the heatproof temperature as well as the electroconductivity and the thermal conductivity of the heat-resistant resin contained in the resin film, and the chip of a thermoelectric conversion material, and includes known materials such as Sn, an Sn/Pb alloy, an Sn/Ag alloy, an Sn/Cu alloy, an Sn/Sb alloy, an Sn/In alloy, an Sn/Zn alloy, an Sn/In/Bi alloy, an Sn/In/Bi/Zn alloy, an Sn/Bi/Pb/Cd alloy, an Sn/Bi/Pb alloy, an Sn/Bi/Cd alloy, a Bi/Pb alloy, an Sn/Bi/Zn alloy, an Sn/Bi alloy, an Sn/Bi/Pb alloy, an Sn/Pb/Cd alloy, and an Sn/Cd alloy. From the viewpoint of lead-free and/or cadmium-free composition, melting point, electroconductivity and thermal conductivity, alloys such as a 43Sn/57Bi alloy, a 42Sn/58Bi alloy, a 40Sn/56Bi/4Zn alloy, a 48Sn/52In alloy, and a 39.8Sn/52In/7Bi/1.2Zn are preferred.

Examples of commercial products of solder materials usable here include a 42Sn/58Bi alloy (from Tamura Corporation, product name: SAM10-401-27), a 41Sn/58Bi/Ag alloy (from Nihon Handa Co., Ltd., product name: PF141-LT7HO), and a 96.5Sn3Ag0.5Cu alloy (from Nihon Handa Co., Ltd., product name: PF305-207BTO).

The thickness of the solder material layer (after heated and cooled) is preferably 10 to 200 μm, more preferably 20 to 150 μm, even more preferably 30 to 130 μm, especially more preferably 40 to 120 μm. When the thickness of the solder material layer falls within the range, adhesiveness between a chip of a thermoelectric conversion material and an electrode is readily attained.

The method of applying a solder material to a substrate may be any known method of stencil printing, screen printing or dispensing. The heating temperature varies depending on the solder material and the resin film, and is generally 150 to 280° C. for 3 to 20 minutes.

Not specifically limited, the electroconductive adhesive to constitute the electroconductive adhesive layer includes an electroconductive paste. The electroconductive paste includes a copper paste, a silver paste and a nickel paste. In the case where a binder is used, the binder may be an epoxy resin, an acrylic resin or an urethane resin.

The method of applying an electroconductive adhesive to a resin film may be any known method of screen printing or dispensing.

The thickness of the electroconductive adhesive layer is preferably 10 to 200 μm, more preferably 20 to 150 μm, even more preferably 30 to 130 μm, further more preferably 40 to 120 μm.

Not specifically limited, the sintering bond to constitute the sintering bond layer includes a sintering paste. For example, the sintering paste is formed of a micron-size metal powder and a nano-size metal particles, and differing from the above-mentioned electroconductive adhesive, the sintering paste is to directly bond metal by sintering, and may contain a binder such as an epoxy resin, an acrylic resin or an urethane resin.

The sintering paste includes a silver sintering paste, and a copper sintering paste.

The method of applying a sintering boding agent to a resin film may be any known method of screen printing, stencil printing or dispensing. The sintering condition may vary depending on the metal material to be used, and is generally at 100 to 300° C. for 30 to 120 minutes.

Regarding commercial products of the sintering bond, for example, as a silver sintering paste, a sintering paste (product name, CT2700R7S, from Kyocera Corporation), and a sintering metal bonding material (product name, MAX102, by Nihon Handa Co., Ltd.) are usable.

The thickness of the sintering bond layer is preferably 10 to 200 μm, more preferably 20 to 150 μm, even more preferably 30 to 130 μm, especially preferably 40 to 120 μm.

<Thermoelectric Conversion Material Chip Mounting Step>

The thermoelectric conversion material chip mounting step is, for example, the step (Iv) in the thermoelectric conversion module production method of the present invention, that is, a step of mounting one surface of the chip of a thermoelectric conversion material produced according to the production method for a chip of a thermoelectric conversion material mentioned above, on the bonding material layer 1 formed in the step (III). For example, as in FIG. 4(c), this is a step of mounting the chip 13p of a P-type thermoelectric conversion material having the solder-receiving layers 14a and 14b and the chip 13n of an N-type thermoelectric conversion material having the solder-receiving layers 14a and 14b, on the solder material layer 17 on the electrode 16 on the resin film 15 so as to form a pair of those chips on the electrode 16, using a hand part 22 of a chip mounter (not shown). (After thus mounted, the chips are as in the embodiment of (d).)

Regarding the arrangement of the chip of a P-type thermoelectric conversion material and the chip of an N-type thermoelectric conversion material, those of the same type may be combined depending on the intended use, or the chips may be randomly combined, for example, like " . . . NPPN . . . " or " . . . PNPP . . . " From the viewpoint of achieving theoretically high thermoelectric performance, preferably, plural pairs of a chip of a P-type thermoelectric conversion material and a chip of an N-type thermoelectric conversion material are arranged via an electrode.

Not specifically limited, the method for mounting a chip of a thermoelectric conversion material on the bond material layer 1 may be any known method. For example, a method is employable, in which one or plural chips of a thermoelectric conversion material are handled with a chip mounter, and positioned using a camera, and mounted on the layer.

Preferably, the chip of a thermoelectric conversion material is mounted using a chip mounter from the viewpoint of handleability, positioning accuracy and mass-productivity.

<Bonding Step>

The bonding step is a step in the thermoelectric conversion module production method of the present invention, for example, the step (V) of bonding one surface of the chip of a thermoelectric conversion material mounted in the step (IV) to the above-mentioned first electrode via the above-mentioned bonding material layer 1 formed in the step (III). For example, as in FIG. 4(*c*), this is a step of heating the solder material layer 7 at a predetermined temperature, keeping it for a predetermined period of time and then restoring it to room temperature.

Also the step is, for example, the step (VI) in the thermoelectric conversion module production method of the present invention, that is, a step of bonding the other surface of the chip of a thermoelectric conversion material after the step (V) to the second electrode formed in the step (II) via the bonding material layer 2. For example, as in FIG. 4(*f*), this is a step of bonding the surface of the solder-receiving layer 14*b* on the chip 13*p* of a P-type thermoelectric conversion material and the surface of the solder-receiving layer 14*b* on the chip 13*n* of P-type thermoelectric conversion material in (e) to the electrode 16 on the resin film 15, each via the solder material layer 17. FIG. 4(*g*) shows an embodiment after the solder material layer 17 in (f) is heated and cooled (solder material layer 17').

The heating temperature and the holding time of the bonding conditions are as mentioned above. FIG. 4(*e*) shows an embodiment after the solder material layer 17 is restored to room temperature. (The solder material layer 17' is solidified after heating and cooling and its thickness reduces.)

Preferably, the chip is bonded to the electrode via the above-mentioned bonding material, that is, via a solder material layer, an electroconductive adhesive layer or a sintering bond layer. In the case where a solder material layer is used, preferably, the chip is bonded via a solder-receiving layer from the viewpoint of improving adhesiveness.

A combination of bonding material layers to be on the electrodes on a pair of resin films in the thermoelectric conversion module (except the case where any of a pair of resin films does not have an electrode) is not specifically limited, but, from the viewpoint of preventing mechanical deformation of thermoelectric conversion modules so as to prevent degradation of thermoelectric performance, a combination of solder material layers, a combination of electroconductive adhesive layers, or a combination of sintering bond layers is preferred.

According to the production method for a chip of a thermoelectric conversion material, and the production method for a thermoelectric conversion material using the chip of the present invention, a chip of a thermoelectric conversion material can be formed in a simplified manner, and using the chip, a thermoelectric conversion module can be produced while preventing degradation of thermoelectric performance derived from formation of an alloy layer owing to diffusion between a thermoelectric conversion material and an electrode in the annealing step in a conventional process, and in addition, since the thermoelectric semiconductor material to constitute the chip of a thermoelectric conversion material can be annealed at an optimum annealing temperature, a thermoelectric conversion module having more improved thermoelectric performance can be produced.

[Production Method for Thermoelectric Conversion Module]

The production method for a thermoelectric conversion module of the present invention is a method for producing a thermoelectric conversion module of a combination of plural chips of a thermoelectric conversion material formed of a thermoelectric semiconductor composition, including: (i) a step of forming a sacrificial layer on a substrate, (ii) a step of forming a chip of a thermoelectric conversion material on the sacrificial layer formed in the step (i), (iii) a step of annealing the chip of a thermoelectric conversion material formed in the step (ii), (iv) a step of preparing a first layer having a first resin film and a first electrode in that order, (v) a step of preparing a second-A layer having a second resin film and a second electrode in that order, or a second-B layer having a second resin film but not having an electrode, (vi) a step of bonding one surface of the chip of a thermoelectric conversion layer annealed in the step (iii), to the electrode of the first layer prepared in the step (iv) via a bonding material layer 1, (vii) a step of peeling the other surface of the chip of a thermoelectric conversion material after the step (vi) from the sacrificial layer, and (viii) a step of bonding the other surface of the resultant chip of a thermoelectric conversion material peeled in the step (vii), to the second electrode of the second-A layer prepared in the step (v) via a bonding material layer 2, or to the second-B layer prepared in the step (v) via a bonding material layer 3.

The production method for a thermoelectric conversion module of the present invention is characterized in that a thermoelectric conversion module is produced in the form of a chip of a thermoelectric conversion material produced through the steps (i), (ii) and (iii). Here, the steps (i), (ii) and (iii) correspond to the sacrificial layer forming step (A), the thermoelectric conversion material chip forming step (B) and the annealing step (C), respectively, in the above-mentioned production method for a chip of a thermoelectric conversion material of the present invention, and are completely the same processes, and one example of the case is the embodiment described with reference to FIG. 1. The substrate, the sacrificial layer, and the thin film of a thermoelectric semiconductor composition to be used, as well as preferred materials constituting these, thickness and formation methods are all the same as those mentioned hereinabove.

In the thermoelectric conversion module production method of the present invention, from the viewpoint of thermoelectric performance, preferably, the step (v) is a step of preparing a second-A layer having a second resin film and a second electrode in that order, and the step (viii) is a step of bonding the other surface of the chip of a thermoelectric conversion material peeled in the step (vii), to the second electrode of the second-A layer prepared in the step (v) via a bonding material layer 2.

The thermoelectric conversion module produced in the above process corresponds to the above-mentioned n-type thermoelectric conversion module.

In the thermoelectric conversion module production method of the present invention, from the viewpoint of thermoelectric performance, preferably, the step (v) is a step of preparing a second-B layer having a second resin film but not having an electrode, and the step (viii) is a step of bonding the other surface of the chip of a thermoelectric conversion material peeled in the step (vii), to the second-B layer prepared in the step (v) via a bonding material layer 3.

The thermoelectric conversion module produced in the above process corresponds to the above-mentioned in-plane-type thermoelectric conversion module.

Hereinunder the production method for a thermoelectric conversion module of a combination of plural chips of a thermoelectric conversion material formed of a thermoelectric semiconductor composition is described with reference to drawings.

Figure 2:
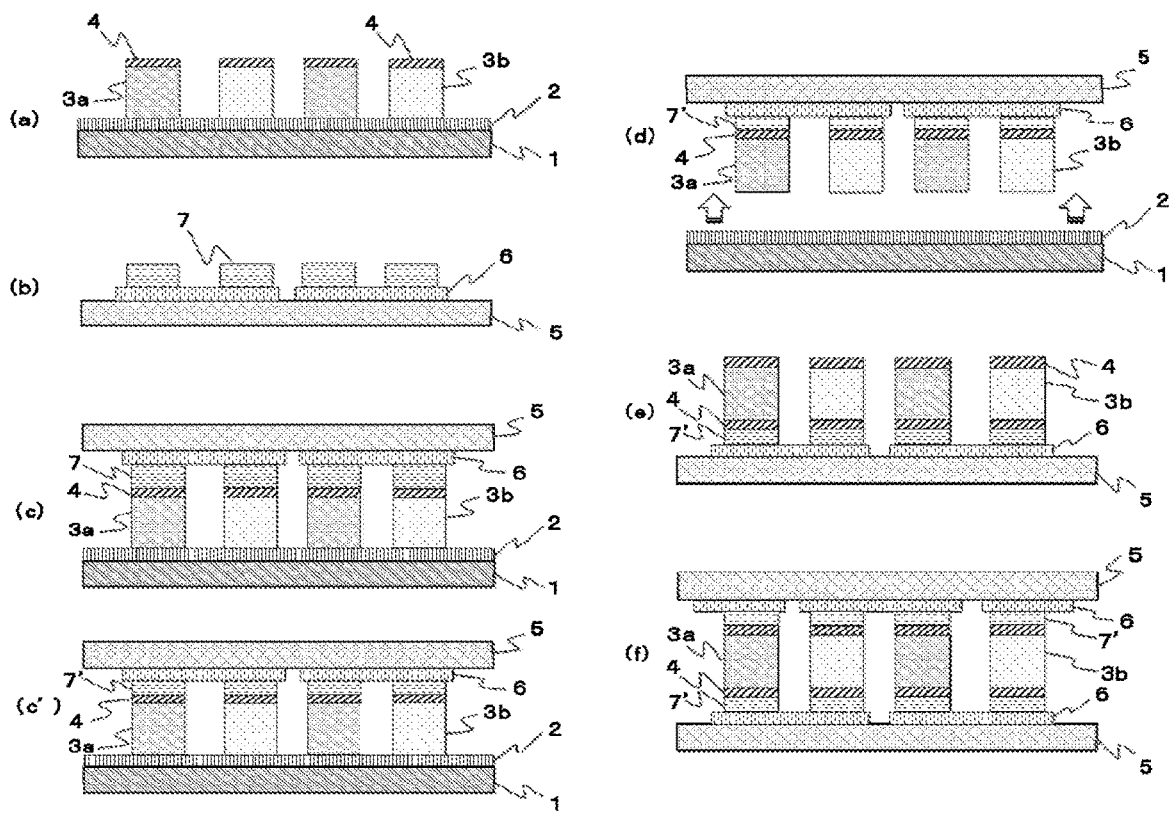
FIG. 2 is an explanatory view showing a flow of an example of an embodiment of a process according to a method for producing a thermoelectric conversion module of a combination of plural chips of a thermoelectric conversion material formed of a thermoelectric semiconductor material of the present invention.

FIG. 2 is an explanatory view showing a flowchart of an example (n-type thermoelectric conversion module) of an embodiment of a step according to a method for producing a thermoelectric conversion module of a combination of plural chips of a thermoelectric conversion material formed of a thermoelectric semiconductor composition of the present invention. (a) is a cross-sectional view after a solder-receiving layer is formed on one surface (upper surface) of a chip of a thermoelectric conversion material; (b) is a cross-sectional view after an electrode and a solder material layer are formed on a resin film; (c) is a cross-sectional view after the electrode on the resin film formed in (b) is bonded to surface (upper surface) of the chip of a thermoelectric conversion material via the solder material layer and the solder-receiving layer formed in (a); (c') is a cross-sectional view after the solder material layer is bonded by heating and cooling; (d) is a cross-sectional view after the other surface (lower surface) of the chip of a thermoelectric conversion material is peeled from a sacrificial layer; (e) is a cross-sectional view after a solder-receiving layer is formed on the other surface (lower surface) of the chip of a thermoelectric conversion material on the resin film formed in (d); and (f) is a cross-sectional view after the electrode formed on the resin film in (b) is bonded to the other surface (lower surface) of the chip of a thermoelectric conversion material via the solder material layer and the solder-receiving layer of (e).

<Electrode Forming Step>

The electrode forming step is a step of forming a first electrode on a first resin film in the step (iv) of preparing a first layer having a first resin film and a first electrode in that order, in the thermoelectric conversion module production method of the present invention. Also, the step is a step of forming a second electrode on a second resin film in the step (v) of preparing a second-A layer having a second rein film and a second electrode in that order. For example, as in FIG. 2(b), this is a step of forming a metal layer on the resin film 5 and patterning it in a predetermined manner to form an electrode 6.

(Resin Film)

The thermoelectric conversion module according to the production method for a thermoelectric conversion module of the present invention uses a first resin film and a second resin film not having any influence on reduction in the electrical conductivity of a thermoelectric conversion material and on increase in the thermal conductivity thereof.

The resin film for the first resin film and the second resin film may be formed of the same material as that for the above-mentioned resin film, and the thickness, the 5% weight-loss temperature to be measured in thermogravimetry, the rate of dimensional change in heating measured at 200° C., and the linear expansion coefficient in the in-plane direction thereof are all the same as above.

(Electrode)

The metal material for the first electrode and the second electrode of the thermoelectric conversion module of the present invention may be the same metal material as that for the above-mentioned electrode, and the thickness of the layer of the electrode, and the electrode formation method are all the same as above.

<Electrode Bonding Step 1>

The electrode bonding step 1 is the step (vi) in the production method for a thermoelectric conversion module of the present invention, and is a step of bonding one surface of the chip of a thermoelectric conversion layer annealed in the step (iii), to the first electrode of the first layer prepared in the step (iv) via a bonding material layer 1.

The electrode bonding step 1 is, for example, as in FIG. 2(c), a step of attaching a chip 3a of a P-type thermoelectric conversion material and a chip 3b of an N-type thermoelectric conversion material to the electrode 7, via the solder material layer 7 on the electrode 6 on the resin film 5 and via the solder-receiving layer 4 formed on one surface of each of the chip 3a of a P-type thermoelectric conversion material and the chip 3b of an N-type thermoelectric conversion material, then heating the solder material layer 7 at a predetermined temperature and holding it as such for a predetermined period of time, and thereafter restoring it to room temperature to thereby bond the chip 3a of a P-type thermoelectric conversion material and the chip 3b of an N-type thermoelectric conversion material to the electrode 7. The heating temperature and the holding time will be described hereinunder. FIG. 2(c') shows an embodiment after the solder material layer 7 is restored to room temperature. (The solder material layer 7' is solidified by heating and cooling, and the thickness thereof is reduced)

(Step of Forming Bonding Material Layer 1)

The electrode bonding step 1 includes a step of forming a bonding material layer 1.

The step of forming a bonding material layer 1 is a step of forming a bonding material layer 1 on the first electrode formed in the step (iv), in the step (vi) of the production method for a thermoelectric conversion module of the present invention.

The step of forming a bonding material layer 1 is, for example, as in FIG. 2(b), a step of forming a solder material layer 7 on the electrode 6.

The bonding material to constitute the bonding material layer 1 may be the same as the above-mentioned bonding material, and includes a solder material, an electroconductive adhesive, and a sintering bond, and preferably, these are formed as a solder material layer, an electroconductive adhesive layer and a sintering bond layer, respectively, on the electrode.

The solder material to constitute the solder material layer may be the same solder material as that used for the above-mentioned solder material layer, and the thickness, the coating method, the heating temperature, and the holding time for the solder material layer are all the same as above.

The electroconductive adhesive to constitute the electroconductive adhesive layer may be the same electroconductive adhesive as that for the above-mentioned electroconductive adhesive layer, and the thickness of the electroconductive adhesive layer and the coating method for the layer are all the same as above.

The sintering bond to constitute the sintering bond layer may be the same sintering bond as that for the above-mentioned sintering bond layer, and the thickness, the coating method, the sintering temperature and the holding time for the sintering bond layer are all the same as above.

In the case where a solder material layer is used, preferably, the layer is bonded via the above-mentioned solder-receiving layer from the viewpoint of improving the adhesiveness to chips of a thermoelectric conversion material.
(Solder-Receiving Layer Forming Step)

In the case where the above-mentioned n-type thermoelectric conversion module and the above-mentioned in-plane-type thermoelectric conversion module are produced in the production method for a thermoelectric conversion module of the present invention, preferably, the method further includes a step of forming a solder-receiving layer on one surface of the chip of a thermoelectric conversion material annealed in the step (iii).

As mentioned above, the solder-receiving layer forming step is a step of forming a solder-receiving layer on a chip of a thermoelectric conversion material, and is, for example, as in FIG. 2(a), a step of forming the solder-receiving layer 4 on one surface of the chip 3a of a P-type thermoelectric conversion material and the chip 3b of an N-type thermoelectric conversion material.

The solder-receiving layer for use in the present invention may be formed of the same metal material as that for the above-mentioned solder-receiving layer, and the thickness of the solder-receiving layer and the formation method for the layer are all the same as above.

<Chip Peeling Step>

The chip peeling step is the step (vii) in the production method for a thermoelectric conversion module, and is a step of peeling the other surface of the chip of a thermoelectric conversion material after the step (vi), from the sacrificial layer.

The chip peeling step is, for example, as in FIG. 2(d), a step of peeling the other surface of the chip 3a of a P-type thermoelectric conversion material and that of the chip 3b of an N-type thermoelectric conversion material from the sacrificial layer 2.

Not specifically limited, the thermoelectric conversion material peeling method may be any method capable of peeling chips of a thermoelectric conversion material all at a time from a sacrificial layer.

<Electrode Bonding Step 2>

The electrode bonding step 2 is included in the step (viii) of the production method for a thermoelectric conversion module of the present invention, and is a step of bonding the other surface of the chip of a thermoelectric conversion material peeled in the step (vii) to the second electrode of the second-A layer prepared in the step (v), via a bonding material layer 2.

The electrode bonding step 2 is, for example, as in FIG. 2(f), a step of bonding the other surface of the chip 3a of a P-type thermoelectric conversion material and that of the chip 3b of an N-type thermoelectric conversion material to the electrode 6 on the resin film 5, via the solder-receiving layer 4 and the solder material layer 7.

All the materials for the second-A layer, the second electrode and the second resin film may be the same as those described for the electrode bonding step 1, and the bonding method is also the same.

Preferably, the chips are bonded to the electrode via the above-mentioned solder material layer, the electroconductive adhesive layer of the sintering bond layer.

(Step of Forming Bonding Material Layer 2)

The electrode bonding step 2 includes a step of forming a bonding material layer 2.

The step of forming a bonding material layer 2 is a step of forming a bonding material layer 2 on the second electrode formed of the second-A layer prepared in the step (v), in the step (viii) of the production method for a thermoelectric conversion module of the present invention.

For the bonding material layer 2, the same material as that for the bonding material 1 can be used, and the formation method and the thickness are all the same as above.

In the case where a solder material layer is used in producing a π-type thermoelectric conversion module, preferably, the production method further includes a step of forming a solder-receiving layer on the other surface of the chip of a thermoelectric conversion material peeled in the step (vii).

For example, as in FIG. 2(e), this is a step of forming a solder-receiving layer 4 on the other surface of the chip 3a of a P-type thermoelectric material and that of the chip 3b of an N-type thermoelectric conversion material.

(Resin Film Bonding Step)

The resin film bonding step is included in the step (viii) in the production method for a thermoelectric conversion module of the present invention, and is a step of bonding the other surface of the chip of a thermoelectric conversion material peeled in the step (vii) to the second-B layer having a second resin film but not having an electrode prepared in the step (v), via a bonding material layer 3. The second resin film is as mentioned above. A bonding material layer 3 is used for bonding to the second-B layer having a second resin film but not having an electrode.

The bonding material to constitute the bonding material layer 3 is preferably a resin material, and the resin material layer is formed on a resin film.

The resin material preferably contains a polyolefin-based resin, an epoxy resin, or an acrylic resin. Further, the resin material preferably has pressure-sensitive adhesiveness, and has low water vapor permeability. In this description, pressure-sensitive adhesiveness means that a resin material has pressure-sensitive adhesiveness, or ordinary adhesiveness, or has temporal pressure-sensitive adhesiveness enabling adhesion under pressure at the initial stage of adhering.

The resin material layer can be formed according to a known method.

The thickness of the resin material layer is preferably 1 to 100 μm, more preferably 3 to 50 μm, even more preferably 5 to 30 μm.

The combination of bonding material layers for use for the electrode on a pair of resin films in the thermoelectric conversion module (excepting a case not having an electrode on any of a pair or resin films) is not specifically limited, but as mentioned above, from the viewpoint of preventing mechanical deformation of a thermoelectric conversion module so as to prevent degradation of thermoelectric performance, a combination of solder material layers, a combination of electroconductive adhesive layers, or a combination of sintering bond layers is preferred.

(Other Production Method for Thermoelectric Conversion Module)

Other examples of the production method for a thermoelectric conversion module using the chip produced according to the production method for a chip of a thermoelectric conversion material of the present invention are mentioned below.

Specifically, one example is a method of producing a thermoelectric conversion module, in which plural chips of a thermoelectric conversion material are individually peeled from the sacrificial layer one by one to give individual plural chips and the plural chips are arranged one by one on a predetermined electrode on a resin film.

For the method of arranging plural chips of a thermoelectric conversion material on an electrode, a known method is employable in which individual chips are handled with a robot one by one, and then positioned and arranged using a microscope.

According to the production method for a chip of a thermoelectric conversion material or the present invention, and according to the production method for a thermoelectric conversion module of a combination of plural chips of a thermoelectric conversion material formed of a thermoelectric semiconductor composition of the present invention, chips of a thermoelectric conversion material can be produced in a simple method, and the resultant thermoelectric conversion module can prevent degradation of thermoelectric performance derived from formation of an alloy layer owing to diffusion between the thermoelectric conversion material and the electrode in a conventional annealing step.

EXAMPLES

Next, the present invention is described in more detail by reference to Examples, but it should be construed that the present invention is not limited to these Examples at all.

The peelability of chips of a thermoelectric conversion material from the sacrificial layer in the test pieces having chips of a thermoelectric conversion material produced in Examples 1 to 5 and Comparative Example 1 was evaluated according to the following method.

<Evaluation of Peelability>
(Peelability Evaluation 1)

A thin film of a thermoelectric conversion material of the test pieces produced in Examples 1 to 5 and Comparative Example 1 was evaluated for the adhesive strength thereof based on the judgement in Table 1 (grouping of test results) of JIS K5600-5-6 shown below, according to the cross-cut test described in JIS K5600-5-6:1999, thereby evaluating the peelability of the thermoelectric conversion material from the test piece in the present invention.
(Abstract from "Table 1 Grouping of Test Results")
Group 0: The cut edge is completely smooth, and there is no peel from every lattice.
Group 1: A little peeling of coating film at crossing of cuts. The influenced crosscuts are not clearly more than 5%.
Group 2: The coating film peels along the cut edge and/or at the crossing. The influenced crosscuts are clearly more than 5%, but are not more than 15%.
Group 3: The coating film much peels partly or entirely along the cut edge, and/or various parts of cuts peel partly or entirely. The influenced crosscuts are clearly more than 15%, but are not more than 35%.
Group 4: The coating film much peels partly or entirely along the cut edge, and/or several cuts peel partly or entirely. The influenced crosscuts are clearly not more than 65%.
Group 5: Any peeling degree not grouped even by Group 4.
(Peelability Evaluation 2)

The electric resistivity of the back surface of the thermoelectric conversion material peeled from the test piece, that is, the surface thereof kept in contact with the sacrificial layer was measured using a low resistance measuring apparatus (Model: RM3545, by Hioki Co., Ltd.), in an environment at 25° C. and 60% RH.

Based on the results of the peelability evaluation 1 and the peelability evaluation 2, the comprehensive peelability was evaluated based on the following criteria (comprehensive evaluation).
A: Group 5, and the electric resistivity is 1 (52) or less (this means that the sacrificial layer did not remain on the back surface of the peeled thermoelectric conversion material).
B: Other than Group 5, and the electric resistivity is more than 1 (51) (this means the possibility that the sacrificial layer could have remained on the back surface of the peeled thermoelectric conversion material).

Example 1

<Production of Test Piece of Thermoelectric Conversion Module>
(1) Production of Thermoelectric Semiconductor Composition
(Production of Thermoelectric Semiconductor Fine Particles)

Using a planetary ball mill (Premium Line P-7, by Fritsch Japan Co., Ltd.), a P-type bismuth telluride $Bi_{0.4}Te_3Sb_{1.6}$ (by Kojundo Chemical Laboratory Co., Ltd., particle size: 180 µm) of a bismuth-tellurium-based thermoelectric semiconductor material was ground in a nitrogen gas atmosphere to give thermoelectric semiconductor fine particles having an average particle size of 2.0 µm. The resultant ground thermoelectric semiconductor fine particles were analyzed for particle size distribution, using a laser diffraction particle size analyzer (from Malvern Corporation, Mastersizer 3000).
(Preparation of Coating Liquid of Thermoelectric Semiconductor Composition)

92 parts by mass of the P-type bismuth telluride $Bi_{0.4}Te_{2.0}Sb_{1.6}$ fine particles obtained in the above, 3 parts by mass of a polyamic acid being a polyimide precursor as a heat-resistant resin (poly(pyromellitic dianhydride-co-4, 4'-oxydianiline)amide acid solution by Sigma-Aldrich Corporation, solvent: N-methylpyrrolidone, solid concentration: 15% by mass), and 5 parts by mass of an ionic liquid, N-butyl pyridinium bromide were mixed and dispersed to give a coating liquid of a thermoelectric semiconductor composition.
(2) Formation of Thin Film of Thermoelectric Conversion Material As a sacrificial layer, a polymethyl methacrylate resin solution having a solid content of 10%, prepared by dissolving a polymethyl methacrylate resin (PMMA) (trade name: Polymethyl Methacrylate, by Sigma Aldrich Corporation) in toluene was applied onto a glass substrate having a thickness of 0.7 mm (trade name: Blue Sheet Glass, by Kawamura Kyuzo Shoten Co., Ltd.) according to a spin coating method to form a film having a dry thickness of 1.0 µm.

Next, via a metal mask, the coating liquid prepared in the above (1) was applied onto the sacrificial layer according to a screen printing method, and dried in an argon atmosphere at a temperature of 120° C. for 10 minutes to form a thin film having a thickness of 50 µm. Next, the resultant thin film was annealed in a mixed gas atmosphere of hydrogen and argon (hydrogen/argon=3 vol %/97 vol %) by heating at a heating rate of 5 K/min, and kept at 400° C. for 1 hour to form a thermoelectric conversion material through crystal growth of thermoelectric semiconductor material fine particles, and hence, a test piece of a thermoelectric conversion material was produced. The peelability between the thermoelectric conversion material and the sacrificial layer of the resultant test piece was evaluated. The electric resistance value of the back surface of the thermoelectric conversion material peeled from the test piece, that is, the surface on the side that had been kept in contact with the sacrificial layer was measured. The results are shown in Table 1.

Example 2

A test piece was produced in the same manner as in Example 1, except that an N-type bismuth telluride $Bi_2Te_3$ was used as the thermoelectric semiconductor material in Example 1. The peelability between the thermoelectric conversion material and the sacrificial layer of the resultant test piece was evaluated. The electric resistance value on the side that had been kept in contact with the sacrificial layer of the surface of the thermoelectric conversion material peeled from the test piece was measured. The results are shown in Table 1.

Example 3

A test piece was produced in the same manner as in Example 1, except that, as the sacrificial layer in Example 1, a fluorine-based release agent (trade name: Optool HD-1100TH, from Daikin Industries, Ltd.) was applied onto a glass substrate to have a thickness of 0.1 μm. The peelability between the thermoelectric conversion material and the sacrificial layer of the resultant test piece was evaluated. The electric resistance value on the side that had been kept in contact with the sacrificial layer of the surface of the thermoelectric conversion material peeled from the test piece was measured. The results are shown in Table 1.

Example 4

A test piece was produced in the same manner as in Example 3, except that an N-type bismuth telluride $Bi_2Te_3$ was used as the thermoelectric semiconductor material in Example 3. The peelability between the thermoelectric conversion material and the sacrificial layer of the resultant test piece was evaluated. The electric resistance value on the side that had been kept in contact with the sacrificial layer of the surface of the thermoelectric conversion material peeled from the test piece was measured. The results are shown in Table 1.

Example 5

A test piece was produced in the same manner as in Example 1, except that, as the sacrificial layer in Example 1, a polystyrene solution having a solid content of 10% prepared by dissolving a polystyrene resin (PS) (trade name: Polystyrene, by Sigma Aldrich Corporation) in toluene was used to form a layer having a dry thickness of 1.0 μm according to a spin coating method. The peelability between the thermoelectric conversion material and the sacrificial layer of the resultant test piece was evaluated. The electric resistance value on the side that had been kept in contact with the sacrificial layer of the surface of the thermoelectric conversion material peeled from the test piece was measured. The results are shown in Table 1.

Comparative Example 1

A test piece was produced in the same manner as in Example 1, except that a sacrificial layer was not formed on the glass substrate in Example 1. The peelability between the thermoelectric conversion material and the sacrificial layer of the resultant test piece was evaluated. The electric resistance value on the side that had been kept in contact with the sacrificial layer of the surface of the thermoelectric conversion material peeled from the test piece was measured. The results are shown in Table 1.

TABLE 1

| | | Sacrificial Layer | | Peelability | | |
|---|---|---|---|---|---|---|
| | Thermoelectric Semiconductor Material | Resin or Release Agent | Thickness (μm) | Electric Resistance (Ω) | Adhesiveness | Comprehensive Evaluation |
| Example 1 | P-type $Bi_{0.4}Te_3Sb_{1.6}$ | PMMA | 1.0 | $2.0 \times 10^{-4}$ | Group 5 | A |
| Example 2 | N-type $Bi_2Te_3$ | PMMA | 1.0 | $1.7 \times 10^{-4}$ | Group 5 | A |
| Example 3 | P-type $Bi_{0.4}Te_3Sb_{1.6}$ | fluorine-based release agent | 0.1 | $2.9 \times 10^{-4}$ | Group 5 | A |
| Example 4 | N-type $Bi_2Te_3$ | fluorine-based release agent | 0.1 | $2.2 \times 10^{-4}$ | Group 5 | A |
| Example 5 | P-type $Bi_{0.4}Te_3Sb_{1.6}$ | polystyrene | 1.0 | $2.4 \times 10^{-4}$ | Group 5 | A |
| Comparative Example 1 | P-type $Bi_{0.4}Te_3Sb_{1.6}$ | — | — | — | Group 1 | B |

It is known that, in Example 1 using a PMMA resin as the sacrificial layer as compared with Comparative Example 1 not having a sacrificial layer (in which bonding failure was confirmed in visual observation), formation of a self-standing film of a thermoelectric conversion material having good peelability was possible. In addition, it is also known that, in Example 5 using a PS resin as the sacrificial layer, formation of a self-standing film having good peelability was possible. Further, it is also known that, in Examples 3 and 4 using a fluorine-based release agent as the sacrificial layer, formation of a self-standing film having good peelability was possible.

Chips of a thermoelectric conversion material produced in Examples 6 to 11 were evaluated in point of the transferability of the pressure-sensitive adhesive sheet to the pressure-sensitive adhesive layer and the peelability of the transferred chip of a thermoelectric conversion material from the pressure-sensitive adhesive layer of the pressure-sensitive adhesive sheet, according to the following methods.

(a) Transferability Evaluation

After transfer, the number N of the chips of a thermoelectric conversion material having the solder-receiving layer remained on the sacrificial layer side was counted, and a ratio of the counted number to the total number P of the chips of a thermoelectric conversion material having the solder-receiving layer (N/P: transfer ratio) was calculated to evaluate the transferability of the chip of a thermoelectric conversion material to the pressure-sensitive adhesive layer of the pressure-sensitive adhesive sheet via the solder-receiving layer, according to the following criteria. After the pressure-sensitive adhesive sheet was stuck, a load of 1 kg/0.01 $mm^2$ was applied to the pressure-sensitive adhesive layer via the substrate on the pressure-sensitive sheet side, left as such for 5 minutes, and then the test piece was peeled from the sacrificial layer and transferred.

A: The transfer ratio is 1≥N/P≥0.90.
B: The transfer ratio is 0.90>N/P≥0.70.
C: The transfer ratio is 0.70>N/P≥0.50.
D: The transfer ratio is 0.50>N/P≥0.

(b) Peelability Evaluation

The peelability of the chip of a thermoelectric conversion material from the pressure-sensitive adhesive layer of the pressure-sensitive adhesive sheet after UV irradiation was evaluated according to the following criteria.

A: The adhesion is weak, and the chip can be readily peeled.
B: The adhesion is relatively weak, and the chip can be peeled.
C: The adhesion is somewhat strong, and the chip cannot be readily peeled.
D: The adhesion is strong, and the chip cannot be peeled.

(c) Evaluation of Adhesive Strength

From the pressure-sensitive adhesive sheet used in Example, two samples each having a width of 25 mm and a length of 100 mm were prepared. The release sheet was peeled from the pressure-sensitive adhesive sheet, and the pressure-sensitive adhesive sheet was stuck to the mirror face of a 6-inch silicon wafer having a thickness of 700 μm (from SUMCO Corporation; arithmetic average roughness (Ra) of the mirror face, 5.0 nm), and then left in an environment at 23° C. and at a relative humidity 50% for 20 minutes. Subsequently, one sample was tested in the same environment using a tensile tester (Tensilon, by Orientec Corporation), according to the method stipulated in JIS Z-0237:2009 under the condition of a peeling speed of 300 mm/min and a peeling angle of 180 degrees, to thereby measure the adhesive strength of the pressure-sensitive adhesive layer of the pressure-sensitive adhesive sheet. Similarly, the other sample was, after irradiated with UV rays from a UV irradiator (Electrodeless UV Lamp System, Model: 1-LH10MKII-10, by Heraeus Corporation) at an illumination of 250 mW/cm$^2$ to be an integrated light quantity of 240 mJ/cm$^2$, tested to measure the adhesive strength of the pressure-sensitive adhesive layer of the pressure-sensitive adhesive sheet.

Example 6

<Production of Chip of Thermoelectric Conversion Material>

A polyethyl methacrylate resin solution having a solid content of 10%, as prepared by dissolving a polymethyl methacrylate resin (PMMA) (trade name: Polymethyl Methacrylate, by Sigma Aldrich Corporation) in toluene, was applied to a soda lime glass substrate having a thickness of 0.7 mm according to a spin coating method to form a film thereon as a sacrificial layer having a dry thickness of 6.0 μm.

Next, using a coating liquid (P) containing thermoelectric semiconductor fine particles to be mentioned below, a chip of a P-type thermoelectric conversion material was formed on the sacrificial layer by coating via a metal mask according to a stencil printing method, and dried in an argon atmosphere at a temperature of 120° C. for 10 minutes to form a thin film having a thickness of 220 μm.

Subsequently, the resultant thin film was annealed in a mixed gas atmosphere of hydrogen and argon (hydrogen/argon=3 vol %/97 vol %) by heating at a heating rate of 5 K/min, and kept at 460° C. for 1 hour to give a chip (annealed) of a P-type thermoelectric conversion material having a thickness of 200 μm through crystal growth of thermoelectric semiconductor material fine particles.

Next, a silver paste (trade name: MDotEC264, by Mitsuboshi Belt Co., Ltd.) was printed on the surface of the resultant (annealed) chip of a P-type thermoelectric conversion material according to a screen printing method to form a solder-receiving layer thereon, and heated at 50° C. for 10 minutes (thickness: 10 μm).

From a dicing tape (pressure-sensitive adhesive sheet) (trade name: D-675Q, by Lintec Corporation, thickness of pressure-sensitive adhesive layer: 30 μm) fixed to a soda lime glass substrate having a thickness of 0.7 mm via a double-adhesive tape, the release film was peeled, and the pressure-sensitive adhesive layer was stuck to the solder-receiving layer on the chip of a P-type thermoelectric conversion material. Next, a load of 1 kg/0.01 mm$^2$ was kept applied to the surface of the glass substrate of the dicing tape in a static state for 5 minutes, and subsequently, the chip f a P-type thermoelectric conversion material was peeled from the sacrificial layer, and transferred to the pressure-sensitive adhesive layer on the dicing tape side via the solder-receiving layer. Next, the same silver paste as above was printed on the surface of the chip of a P-type thermoelectric conversion material having been kept in contact with the sacrificial layer in the same manner as above, and heated at 50° C. for 10 minutes to form a solder-receiving layer (thickness: 10 μm). From the glass surface side of the dicing tape, this was irradiated with UV rays using a UV irradiator (Electrodeless UV Lamp System, Model: 1-LH10MKII-10, by Heraeus Corporation) at an illumination of 250 mW/cm$^2$ to be an integrated light quantity of 240 mJ/cm$^2$. Subsequently, the chip of a P-type thermoelectric conversion material was peeled from the pressure-sensitive adhesive layer on the dicing tape side to give a chip of a P-type thermoelectric conversion material having a solder-receiving layer on both sides of the chip of a P-type thermoelectric conversion material.

(Production Method for Thermoelectric Semiconductor Fine Particles)

Using a planetary ball mill (Premium Line P-7, by Fritsch Japan Co., Ltd.), a P-type bismuth telluride $Bi_{0.4}Te_3Sb_{1.6}$ (by Kojundo Chemical Laboratory Co., Ltd., particle size: 180 pin) of a bismuth-tellurium-based thermoelectric semiconductor material was ground in a nitrogen gas atmosphere to give thermoelectric semiconductor fine particles T1 having an average particle size of 2.0 μm. The resultant ground thermoelectric semiconductor fine particles were analyzed for particle size distribution, using a laser diffraction particle size analyzer (Mastersizer 3000, from Malvern Corporation).

(Preparation of Thermoelectric Semiconductor Composition)

Coating Liquid (P)

76.6 parts by mass of the resultant P-type bismuth telluride-based thermoelectric conversion material fine particles, 16.5 parts by mass of a polyamic acid being a polyimide precursor as a heat-resistant resin (poly(pyromellitic dianhydride-co-4,4'-oxydianiline)amide acid solution, by Sigma-Aldrich Corporation, solvent: N-methylpyrrolidone, solid concentration: 15% by mass), 6.0 parts by mass of an ionic liquid, N-butyl pyridinium bromide, and further 0.9 parts by mass of a mixed liquid, as a diluent, prepared by mixing butyl acetate and N-methylpyrrolidone in a ratio by mass of 8/2 were mixed and dispersed to give a coating liquid (P) of a thermoelectric semiconductor composition.

Example 7

A chip of a P-type thermoelectric conversion material of Example 7 was produced in the same manner as in Example 6, except that, in Example 6, the dicing tape was changed to D-255 (by Lintec Corporation, thickness of pressure-sensitive adhesive layer: 40 μm) and the thickness of the metal mask was changed so that the thickness of the thermoelectric conversion material chip could be as in Table 2.

Example 8

A chip of a P-type thermoelectric conversion material of Example 8 was produced in the same manner as in Example 6, except that, in Example 6, the dicing tape was changed to D-485 (by Lintec Corporation, thickness of pressure-sensitive adhesive layer: 40 μm) and the thickness of the metal mask was changed so that the thickness of the thermoelectric conversion material chip could be as in Table 2.

Example 9

A chip of a P-type thermoelectric conversion material of Example 9 was produced in the same manner as in Example 6, except that, in Example 6, the dicing tape was changed to D-841 (by Lintec Corporation, thickness of pressure-sensitive adhesive layer: 10 μm) and the thickness of the metal mask was changed so that the thickness of the thermoelectric conversion material chip could be as in Table 2.

Example 10

A chip of a P-type thermoelectric conversion material of Example 10 was produced in the same manner as in Example 6, except that, in Example 6, the dicing tape was changed to D-841W (by Lintec Corporation, thickness of pressure-sensitive adhesive layer: 20 μm) and the thickness of the metal mask was changed so that the thickness of the thermoelectric conversion material chip could be as in Table 2.

Example 11

A chip of a P-type thermoelectric conversion material of Example 11 was produced in the same manner as in Example 6, except that, in Example 6, the dicing tape was changed to D-510T (by Lintec Corporation, thickness of pressure-sensitive adhesive layer: 30 μm).

The transferability and the peelability of the P-type thermoelectric conversion material chips produced in Examples 6 to 11 were evaluated. The evaluation results are shown in Table 2.

It is known that, in Examples 6 to 11 using the pressure-sensitive adhesive layer satisfying the requirements (s), (t) and (u) in production of thermoelectric conversion material chips of the present invention, the thermoelectric conversion material chips can be well transferred and peeled.

INDUSTRIAL APPLICABILITY

According to the production method for a chip of a thermoelectric conversion material of the present invention and according to the production method for a thermoelectric conversion module using the chip produced according to the chip production method, formation of an alloy layer owing to diffusion of an electrode and a thermoelectric conversion material can be prevented and, as a result, a problem of degradation of thermoelectric performance can be solved. Simultaneously, the improvement of yield in the production method is expected. Further, the thermoelectric conversion module produced according to the production method of the present invention is flexible and has a possibility of thinning the module (with down-sizing and weight reduction).

The thermoelectric conversion module using the chip produced according to the production method for a chip of a thermoelectric conversion material mentioned above is considered to be applicable to use for power generation for converting exhaust heat from various combustion furnaces in factories, waste combustion furnaces or cement combustion furnaces, or automobile combustion gas exhaust heat or electronics exhaust heat into electricity. Regarding cooling use, for example, the module can be used for temperature control for various sensors in semiconductor devices, CCD (charge coupled devices), MEMS (micro electro mechanical systems), optical receivers and others, in the field of electronics instruments.

REFERENCE SIGNS LIST

1: Substrate
2: Sacrificial Layer
3: Chip of Thermoelectric Conversion Material
3a: Chip of P-type Thermoelectric Conversion Material
3b: Chip of N-type Thermoelectric Conversion Material
4: Solder-Receiving Layer
5: Resin Film
6: Electrode
7: Solder Material Layer (during formation)
7': Solder Material Layer (after bonded)

TABLE 2

| | Thermoelectric Conversion Material Chip | | | Pressure-Sensitive Adhesive Layer | | |
| | | | | | Adhesive Strength (N/25 mm) | |
| | Thermoelectric Semiconductor Material | Thickness (μm) | Transferability | Peelability | Thickness (μm) | before adhesive strength reduction treatment | after adhesive strength reduction treatment |
| --- | --- | --- | --- | --- | --- | --- | --- |
| Example 6 | P-type $Bi_{0.4}Te_{3.0}Sb_{1.6}$ (pattern) | 200 | A | A | 30 | 3.3 | 0.11 |
| Example 7 | P-type $Bi_{0.4}Te_{3.0}Sb_{1.6}$ (pattern) | 250 | A | B | 40 | 2.4 | 0.20 |
| Example 8 | P-type $Bi_{0.4}Te_{3.0}Sb_{1.6}$ (pattern) | 300 | B | A | 40 | 6 | 0.09 |
| Example 9 | P-type $Bi_{0.4}Te_{3.0}Sb_{1.6}$ (pattern) | 150 | C | A | 10 | 25 | 0.05 |
| Example 10 | P-type $Bi_{0.4}Te_{3.0}Sb_{1.6}$ (pattern) | 150 | B | A | 20 | 27 | 0.05 |
| Example 11 | P-type $Bi_{0.4}Te_{3.0}Sb_{1.6}$ (pattern) | 200 | A | C | 30 | 19 | 0.70 |

11: Substrate
12: Sacrificial Layer
13: Chip of Thermoelectric Conversion Material
13': Chip of Thermoelectric Conversion Material (individually chip)
13p: Chip of P-type Thermoelectric Conversion Material
13n: Chip of N-type Thermoelectric Conversion Material
14a, 14b: Solder-Receiving Layer
15: Resin Film
16: Electrode
17: Solder Material Layer (during formation)
17': Solder Material Layer (after bonded)
21: Adhesive Sheet
21a: Substrate
21b: Pressure-Sensitive Adhesive Layer
22: Hand Part
31: Substrate
32: Pattern Frame
32': Stainless Steel
33s: Aperture
33d: Depth of Opening (pattern frame thickness)
33: Opening
34a: Chip of N-type Thermoelectric Conversion Material
34b: Chip of P-type Thermoelectric Conversion Material

The invention claimed is:

1. A method for producing a chip of a thermoelectric conversion material formed of a thermoelectric semiconductor composition, the method comprising:
   (A) forming a sacrificial layer on a substrate,
   (B) forming a chip of a thermoelectric conversion material on the sacrificial layer formed in (A),
   (C) annealing the chip of a thermoelectric conversion material formed in (B), and
   (D) peeling the chip of a thermoelectric conversion material annealed in (C),
   wherein (D) comprises:
   (D-1) peeling the chip of a thermoelectric conversion material annealed in (C) from the sacrificial layer and transferring it to a pressure-sensitive adhesive layer of a pressure-sensitive adhesive sheet, and
   (D-2) lowering the adhesive strength of the pressure-sensitive adhesive layer to peel the chip of a thermoelectric conversion material transferred in (D-1), from the pressure-sensitive adhesive layer.

2. The method for producing a chip of a thermoelectric conversion material according to claim 1, wherein the thickness of the sacrificial layer is from 10 nm to 10 μm.

3. The method for producing a chip of a thermoelectric conversion material according to claim 1, wherein the substrate is one selected from the group consisting of glass, alumina and silicon.

4. The method for producing a chip of a thermoelectric conversion material according to claim 1, wherein the annealing temperature is from 250 to 600° C.

5. The method for producing a chip of a thermoelectric conversion material according to claim 1, wherein, in (D-2), the adhesive strength of the pressure-sensitive adhesive layer is lowered by heating or irradiation with energy ray.

6. The method for producing a chip of a thermoelectric conversion material according to claim 1, wherein the pressure-sensitive adhesive layer comprises an energy ray-curable pressure-sensitive adhesive, a thermally-curable pressure-sensitive adhesive, or a thermally-foamable pressure-sensitive adhesive.

7. The method for producing a chip of a thermoelectric conversion material according to claim 1, wherein the chip of a thermoelectric conversion material is formed according to a stencil printing method.

8. The method for producing a chip of a thermoelectric conversion material according to claim 1, wherein a ratio of the thickness of the pressure-sensitive adhesive layer to the thickness of the chip of a thermoelectric conversion material is from 5/100 to 70/100.

9. The method for producing a chip of a thermoelectric conversion material according to claim 1, wherein a peel adhesion of the pressure-sensitive adhesive layer, before being treated for adhesive strength reduction, to a mirror face of a silicon wafer is at least 1.0 N/25 mm.

10. The method for producing a chip of a thermoelectric conversion material according to claim 1, wherein a peel adhesion of the pressure-sensitive adhesive layer, after being treated for adhesive strength reduction, to a mirror face of a silicon wafer is less than 1.0 N/25 mm.

11. The method for producing a chip of a thermoelectric conversion material according to claim 1, wherein the sacrificial layer comprises a resin or a release agent.

12. The method for producing a chip of a thermoelectric conversion material according to claim 11, wherein the resin is a thermoplastic resin.

13. The method for producing a chip of a thermoelectric conversion material according to claim 12, wherein the thermoplastic resin is a polymethyl methacrylate or a polystyrene.

14. The method for producing a chip of a thermoelectric conversion material according to claim 11, wherein the release agent is a fluorine-based release agent or a silicone-based release agent.

15. The method for producing a chip of a thermoelectric conversion material according to claim 1, wherein the thermoelectric semiconductor composition comprises a thermoelectric semiconductor material, and the thermoelectric semiconductor material is a bismuth-tellurium-based thermoelectric semiconductor material, a telluride-based thermoelectric semiconductor material, an antimony-tellurium-based thermoelectric semiconductor material, or a bismuth-selenide-based thermoelectric semiconductor material.

16. The method for producing a chip of a thermoelectric conversion material according to claim 15, wherein the thermoelectric semiconductor composition further comprises a heat-resistant resin, and an ionic liquid, an inorganic ionic compound, or a combination thereof.

17. The method for producing a chip of a thermoelectric conversion material according to claim 16, wherein the heat-resistant resin is a polyimide resin, a polyamide resin, a polyamideimide resin, or an epoxy resin.

18. A method for producing a thermoelectric conversion module of a combination of plural chips of a thermoelectric conversion material produced in the production method for a chip of a thermoelectric conversion material according to claim 1, the method comprising:
   (I) forming a first electrode on a first resin film,
   (II) forming a second electrode on a second resin film,
   (III) forming a bonding material layer 1 on the first electrode formed in (I),
   (IV) mounting one surface of the chip of a thermoelectric conversion material on the bonding material layer 1 formed in (III),
   (V) bonding one surface of the chip of a thermoelectric conversion material mounted in (IV) to the first electrode via the bonding material layer 1 formed in (111), and (VI) bonding the other surface of the chip of a thermoelectric conversion material after (V) to the second electrode formed in (II) via a bonding material layer 2.

19. The method for producing a chip of a thermoelectric conversion material according to claim 1, further comprising forming a solder-receiving layer on the chip of a thermoelectric conversion material annealed in (C), on the surface opposite to the surface of the chip of a thermoelectric conversion material transferred in (D-2), or a combination thereof.

20. The method for producing a chip of a thermoelectric conversion material according to claim 19, wherein the solder-receiving layer is formed of a metal material.

21. A method for producing a thermoelectric conversion module of a combination of plural chips of a thermoelectric conversion material produced in the production method for a chip of a thermoelectric conversion material according to claim 19, the method comprising:

(XI) forming a first electrode on a first resin film, (XII) forming a second electrode on a second resin film, (XIII) forming a solder material layer on the first electrode formed in (XI), (XIV) mounting one surface of the chip of a thermoelectric conversion material having a solder-receiving layer on the solder material layer formed in (XIII), (XV) bonding one surface of the chip of a thermoelectric conversion material having a solder-receiving layer mounted in (XIV) to the first electrode via the solder material layer formed in (XIII), and (XVI) bonding the solder-receiving layer on the other surface of the chip of a thermoelectric conversion material after (XV) to the second electrode formed in (XII) via the solder material layer.

* * * * *